(12) United States Patent
Li

(10) Patent No.: US 6,519,732 B1
(45) Date of Patent: Feb. 11, 2003

(54) ERROR-CORRECTING ENCODING APPARATUS

(75) Inventor: Jifeng Li, Kanagawa (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/377,393

(22) Filed: Aug. 19, 1999

(30) Foreign Application Priority Data

Aug. 19, 1998 (JP) .......................... 10-232580

(51) Int. Cl.[7] ........................ H03M 13/29; H03M 13/35
(52) U.S. Cl. ........................ 714/755; 714/786; 714/792
(58) Field of Search .................. 714/774, 776, 714/786, 790, 792, 755

(56) References Cited

U.S. PATENT DOCUMENTS

| | | | |
|---|---|---|---|
| 5,406,570 A | | 4/1995 | Berrou et al. |
| 5,436,918 A | * | 7/1995 | Kato et al. ..................... 371/43 |
| 5,446,747 A | | 8/1995 | Berrou |
| 5,751,739 A | * | 5/1998 | Seshadri et al. ............ 370/342 |
| 5,978,365 A | * | 11/1999 | Yi .............................. 370/331 |
| 6,000,054 A | * | 12/1999 | Bahr et al. .................. 714/786 |
| 6,131,180 A | * | 10/2000 | Ramesh ...................... 714/790 |
| 6,272,183 B1 | * | 8/2001 | Berens et al. ............... 375/262 |
| 6,138,260 A1 | * | 9/2001 | Ketseoglou ................. 714/751 |
| 6,289,486 B1 | * | 9/2001 | Lee et al. ................... 714/788 |
| 6,298,463 B1 | * | 10/2001 | Bingeman et al. .......... 714/755 |

OTHER PUBLICATIONS

Fei et al., "The Effects of Time Delay Spread on Turbo–TCM in a Wireless Communication Channel", IEEE 47th Vehicular Technology Conference, 1997, pp. 334–338.*

Narayanan et al., "List Decoding of Turbo Codes", IEEE Transactions on Communications, vol. 46, No. 6, Jun. 1998, pp. 754–762.*

Barbulescu et al., "Rate Compatible Turbo Codes", Electronics Letters, Mar. 30, 1995, vol. 31, No. 7, pp. 535–536.*

Kallel, "Complememtary Punctured Convolutional (CPC) Codes and Their Applications", IEEE Transactions on Communications, vol. 43, No. 6, Jun. 1995, pp. 2005–2009.*

Barbulescu et al., "Interleaver Design for Three Dimensional Turbo Codes", IEEE International Symposium on Information Theory, 1995, p. 37.*

Rowitch et al., "Rate Compatible Punctured Turbo (RCPT) Codes in a Hybrid FEC/ARQ System", IEEE Global Telecommunications Mini–Conference, 1997, pp. 55–59.*

Wang, "Asymptotic Performances of Nonrepetitive and Repetitive Turbo Codes", MILCOM '97, pp. 48–53.*

Holma et al., "Performance of Frames Non–Spread Mode 1 (WB–TDMA) with Turbo Codes", VTC '98, pp. 840–844.*

* cited by examiner

Primary Examiner—Stephen M. Baker
(74) Attorney, Agent, or Firm—Katten Muchin Zavis Rosenman

(57) ABSTRACT

A desired encoding rate is obtained by an error-correcting encoding apparatus including convolution units provided in parallel with each other. The convolution units provided in parallel with each other perform convoluting processes on source data. An interleaver randomizes the source data provided from one of the convolution units. Puncturing units select data elements form parity data sequences produced by the convolution according to predetermined puncturing patterns. A multiplexing unit provides the parity data elements selected by the puncturing units for the output data sequence.

16 Claims, 23 Drawing Sheets

| POSITION (SEQUENCE NUMBER) | 1 | 2 | 3 | 4 | 5 | ..... | N |
|---|---|---|---|---|---|---|---|
| SELECTION INFORMATION | 0 | 1 | 0 | 1 | 1 | ..... | 1 |

BIT DUPLICATION UNIT —81

↓

$C = U_0 \ U_1 \ U_2 \ \underline{\underline{U_2}} \ U_3 \ U_4 \ U_5 \ \underline{\underline{U_5}} \ U_6$

FIG. 14

ERROR-CORRECTING ENCODING APPARATUS

BACKGROUND OF THE INVENTION

The present invention relates to an encoding apparatus, and more specifically to an error-correcting encoding apparatus.

Encoding technology is widely utilized in various fields. For example, in transmitting data, a source apparatus encodes data to be transmitted and sends the encoded data through a communications path so that a destination apparatus receives and decodes the encoded data. When data is stored in a storage device, it is encoded and written to a disk, etc. The encoded data is then decoded after being read from the disk. Encoding normally refers to converting a data sequence from an information source into a different data sequence, and thus the new data sequence obtained by the conversion is referred to as a code.

When encoded data is transmitted, an error may occur in the transmission path. An error may also occur when the encoded data is read for reproduction from a storage device that stores the encoded data. To detect an occurrence of such an error, or to correct such an error, an error-correcting code is frequently used.

A convolutional code is known as one type of error-correcting code. Each time n-bits of data is input for processing a convolutional code. Data of m (m>n) bits is then determined depending on the n-bit data and s-bit data, which is input immediately before the n-bit data is output. Thus, in processing the convolutional code, data of (m−n) bits is added for error correction to the data to be transmitted. As a result, the redundancy of the data is increased, thereby reducing the decoding error rate when the data is decoded.

The ratio of the amount of data to be transmitted (number of bits of source data) to the amount of data obtained by the encoding process (number of bits of output data) is commonly referred to as an encoding rate (or an information rate) R, and is represented by the following equation.

$$R = n/m$$

The encoding rate R is always lower than 1 in an error-correcting code. Generally, the encoding rate R is one of the parameters for determining the error correction capability. For example, the lower the encoding rate R is, the higher the error correction capability becomes.

FIG. 20 is a block diagram showing an example of an existing error-correcting encoding apparatus using a convolutional code. The error-correcting encoding apparatus 500 includes two convolution units 501, 502 provided in parallel with each other. An encoding apparatus including plural convolution units connected in parallel with each other are often referred to as a "turbo-encoding apparatus".

The error-correcting encoding apparatus 500 generates, for source data d, a data sequence x and parity data sequences y1,y2 for correcting the data sequence x. The data sequence x and the parity data sequences y1,y2 are then multiplexed and output. This output is the encoded data of the source data d. Described below is the operation performed when N-bits of source data d is encoded.

The source data d is output as the data sequence x as is, and is also transmitted to the convolution unit 501 and an interleaver 503. The convolution unit 501 performs a convolutional encoding process on the source data d and outputs the parity data sequence y1. The interleaver 503 temporarily stores the source data d and, then reads and outputs the stored source data in an order different from the input order. Thus, the source data d is randomized. The output from the interleaver 503 is then provided to the convolution unit 502. The convolution unit 502 also performs a convolutional encoding process on the output from the interleaver 503, and outputs the parity data sequence y2.

In the above described operations, the error-correcting encoding apparatus 500 generates an N-bit data sequence x, an N-bit parity data sequence y1, and an n-bit parity data sequence y2 for N-bits of source data d. The data sequence x and parity data sequences y1,y2 are, for example, multiplexed for each bit and output as the encoded data. Therefore, in this case, the error-correcting encoding apparatus 500 outputs 3×N bits of data for every N-bits input. As a result, the encoding rate R is 1/3.

FIG. 21 is a block diagram showing an example of a variation of the error-correcting encoding apparatus shown in FIG. 20. The error-correcting encoding apparatus 510 is realized by providing a selection unit 511 for the error-correcting encoding apparatus 500 shown in FIG. 20. According to a predetermined selection pattern, the selection unit 511 selects the parity data sequences y1, y2 respectively generated by the convolutional units 501, 502, and outputs it as a parity data sequence Z. The operation of the selection unit 511 is referred to as a "puncturing" process.

The selection unit 511 alternately selects one bit from the outputs of the convolution units 501, 502. Table 1 shows the output sequence Z produced by the selection unit 511. In Table 1, y1(i) indicates the output from the convolutional unit 501 corresponding to the i-th data element of the source data d, and y2(i) indicates the output from the convolution unit 502 corresponding to the i-th data element of the source data d. When N-bits of source data d is input to the error-correcting encoding apparatus 510, the selection unit 511 outputs a N-bit output sequence Z (y1(1), y2(2), y1(3), y2(4), . . . , y1(N−1), y2(N)).

| $y_1(1)$ | | $y_1(3)$ | | . . . . | $y_1(N-1)$ | |
|---|---|---|---|---|---|---|
| | $y_2(2)$ | | $y_2(4)$ | . . . . | | $y_2(N)$ |

The puncturing operation performed by the selection unit 511 is represented by the following equation.

$$Z = D \cdot P$$
$$= \begin{matrix} y1(i) & y2(i) \\ y1(i+1) & y2(i+1) \end{matrix} \begin{matrix} 1 & 0 \\ 0 & 1 \end{matrix}$$
$$(i = 1, 3, 5, \ldots, N-1)$$

The output sequence Z is obtained by multiplying the data matrix D by the puncturing matrix P. For example, for the i-th data element of the source data d, y1(i) is obtained by multiplying the first row of the data matrix D by the first column of the puncturing matrix P. For the (i+1) the data element of the source data d, y1(i+1) is obtained by multiplying the second row of the data matrix D by the second column of the puncturing matrix P. Therefore, the operation of the selection unit 511 for alternately selecting the outputs of the convolution units 501, 502 bit by bit is represented as an operation of repeatedly performing the above described arithmetic operations.

With the above described configuration, the error-correcting encoding apparatus 510 generates an N-bit data sequence x and an N-bit parity data sequence Z for N-bits of source data d. The data sequence x and the parity data sequence Z are multiplexed bit by bit, and then output as encoded data. Since the error-correcting encoding apparatus 510 outputs 2N bits of data for every N-bits input, the encoding rate R is ½.

U.S. Pat. No. 5,446,747 discloses in detail the above described error-correcting encoding apparatus shown in FIGS. 20 and 21.

In mobile terminal communications systems, it is required to optionally set the data length M of an output sequence from an encoding apparatus in relation to the data length N (number of bits) of source data d. For example, voice data, etc. is normally divided into data having a predetermined data length, and is then transmitted after being stored in a frame having a predetermined data length. Thus, when encoded data is processed in a mobile terminal communications system, voice data, etc. is divided into data having a predetermined data length, encoded and then stored in a frame.

However, the encoding rate R of the conventional error-correcting encoding apparatus shown in FIGS. 20 or 21 is fixed. Therefore, since the data has a predetermined fixed length (the frame in the above-described example), useless information has to be stored to fill the data storage area of the frame.

FIG. 22A shows the process for encoding source data using the error-correcting encoding apparatus 500 shown in FIG. 20 and storing the encoded data in a frame of a fixed length. In this example, the source data d occupies 333 bits, and the data storage area for a frame occupies 1500 bits. In this case, the error-correcting encoding apparatus 500 generates a 333-bit data sequence x, a 333-bit parity data sequence y1, and a 333-bit parity data sequence y2. Thus, to fill the data storage area of a frame, a 501-bit dummy data is required to be stored in the frame, as shown in FIG. 22B. If the frame is transmitted through a network, useless data is transmitted, thereby wasting network resources.

FIG. 23A shows the process of encoding source data using the error-correcting encoding apparatus 510 shown in FIG. 21 and storing the encoded data in a frame of a fixed length. In this example, the source data d occupies 666 bits, and the data storage area of a frame occupies 1500 bits. In this case, the selection unit 511 generates a parity data sequence Z from the parity data sequences y1, y2 in the puncturing process. Therefore, the error-correcting encoding apparatus 510 generates a 666-bit data sequence x, a 666-bit parity data sequence Z. As a result, to fill the data storage area of a frame, a 168-bit dummy data is stored in the frame as shown in FIG. 23B. Therefore, useless data is transmitted as shown in FIG. 22.

Thus, the encoding rate of the conventional error-correcting encoding apparatus having a plurality of convolution units provided in parallel with each other cannot be set to a desired value. Therefore, the source data is encoded and stored in a predetermined frame with poor efficiency.

SUMMARY OF THE INVENTION

An object of the present invention is to obtain a desired encoding rate in an error-correcting encoding apparatus provided with a plurality of convolution units mounted in parallel with each other.

These and other objects are met by an error-correcting encoding apparatus according to the present invention that includes a plurality of convolution units mounted in parallel with each other. A randomization unit is also included for randomizing the source data so that different data sequences are provided for the plurality of convolution units. A selection unit that selects a data element in the output from a corresponding convolution unit according to selection information. The selection information indicates whether or not a data element in each output of the plurality of convolution units is to be selected, and has a data length equal to the data length of each output from the plurality of convolution units. Further, an output unit is included that outputs the source data and a data element selected by the selection unit.

In this configuration, each convolution unit generates a data element for correction of the source data. The selection unit outputs a data element according to the selection information from the data elements generated by the plurality of convolution units. As a result, the number of bits of the encoded data output of the output unit depends on the above described selection information. Therefore, a desired encoding rate can be obtained according to the selection information.

The error-correcting encoding apparatus according to another embodiment of the present invention includes a duplication unit that duplicates a predetermined number of data elements in the source data according to a requested encoding rate. Further, an encoding circuit is provided with a plurality of convolution units connected in parallel with each other, for encoding the source data.

In the above described configuration, the ratio of the data length of the source data to the data length of the output data from the encoding circuit is altered by changing the time the data elements are duplicated. Thus, the encoding rate is changed. If the data elements are duplicated, the decoding characteristic is improved.

Another error-correcting encoding apparatus according to the present invention includes an insertion unit for inserting a predetermined number of dummy bits into the source data according to the requested encoding rate. Further, an encoding circuit is provided with a plurality of convolution circuits mounted in parallel with each other, for encoding the source data into which the dummy bits are inserted by the insertion unit.

In the above described configuration, the ratio of the data length of the source data to the data length of the output data from the encoding circuit is altered. When a predetermined dummy bit (for example, 1) is inserted, a decoding characteristic is improved.

BRIEF DESCRIPTION OF THE DRAWINGS

FIG. 5 is an example of a puncturing table;

FIG. 14 is a diagram showing the operation performed by the bit duplication unit;

DETAILED DESCRIPTION

The error-correcting encoding apparatus according to the present invention is applicable to various fields, for example, a communication system and a data storage device.

Figure 1:
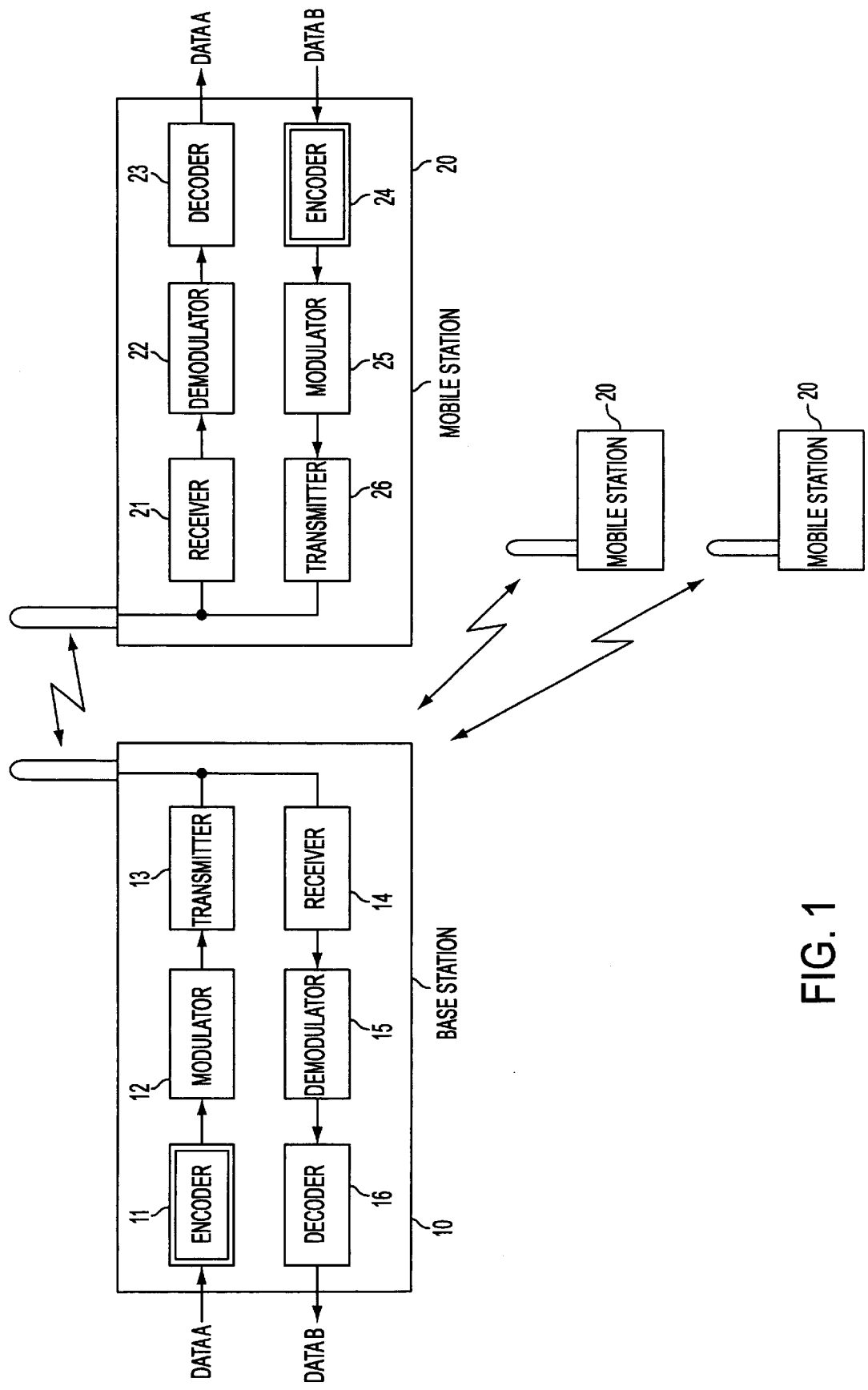
FIG. 1 is a block diagram showing the configuration of a mobile communication system including the error-correcting encoding apparatus according to the present invention.

FIG. 1 shows a mobile communications system to which the error-correcting encoding apparatus according to the present invention is applied. The wireless system, for example, can be a CDMA system. As can be seen, a base station 10 includes an encoder 11 for encoding data (data A) to be transmitted to a mobile station 20. The base station 10 also includes a modulator 12 included for modulating the encoded data and a transmitter 13 for transmitting the modulated data.

A wireless signal transmitted from the base station 10 is received by a receiver 21 of the mobile station 20, demodulated by a demodulator 22, and decoded by a decoder 23. The base station 10 includes a receiver 14 for receiving a signal transmitted from the mobile station 20, a demodulator 15 for demodulating the received signal and a decoder 16 for decoding the demodulated data. The mobile station 20 encodes data (data B) to be transmitted to the base station 10 using an encoder 24, modulates the encoded data using a modulator 25, and transmits the modulated data through a transmitter 26.

In the above described communication system, the error-correcting encoding apparatus according to the present invention corresponds to the encoder 11 in the base station 10 or the encoder 24 in the mobile station 20.

Figure 2:
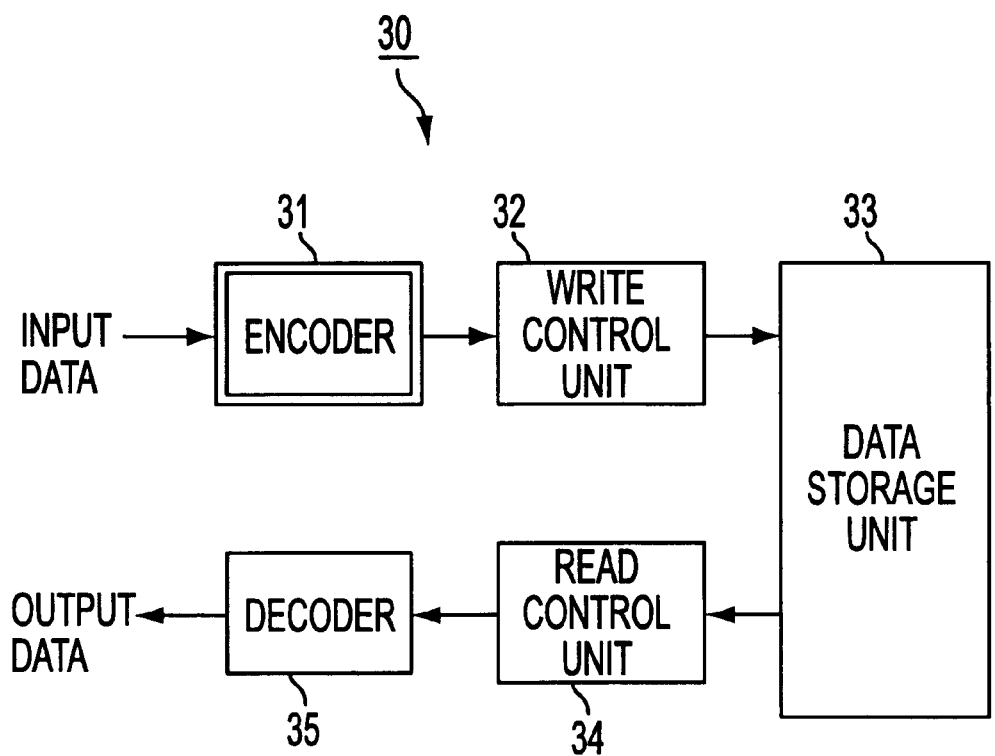
FIG. 2 is a block diagram showing a storage device including the error-correcting encoding apparatus according to the present invention.

FIG. 2 shows a storage device to which the error-correcting encoding apparatus according to the present invention is applied. The storage device 30 includes an encoder 31 for encoding the data to be written to a data storage unit 33 and a write control unit 32 for writing the encoded data to the data storage unit 33. The data storage unit 33 contains a storage medium, for example, an optical disk, magnetic disk, semiconductor memory, etc. The storage device 30 includes a read control unit 34 for reading data from the data storage unit 33 and a decoder 35 for decoding the read data.

In the above described storage medium, the error-correcting encoding apparatus according to the present embodiment corresponds to the encoder 31.

Figure 3:
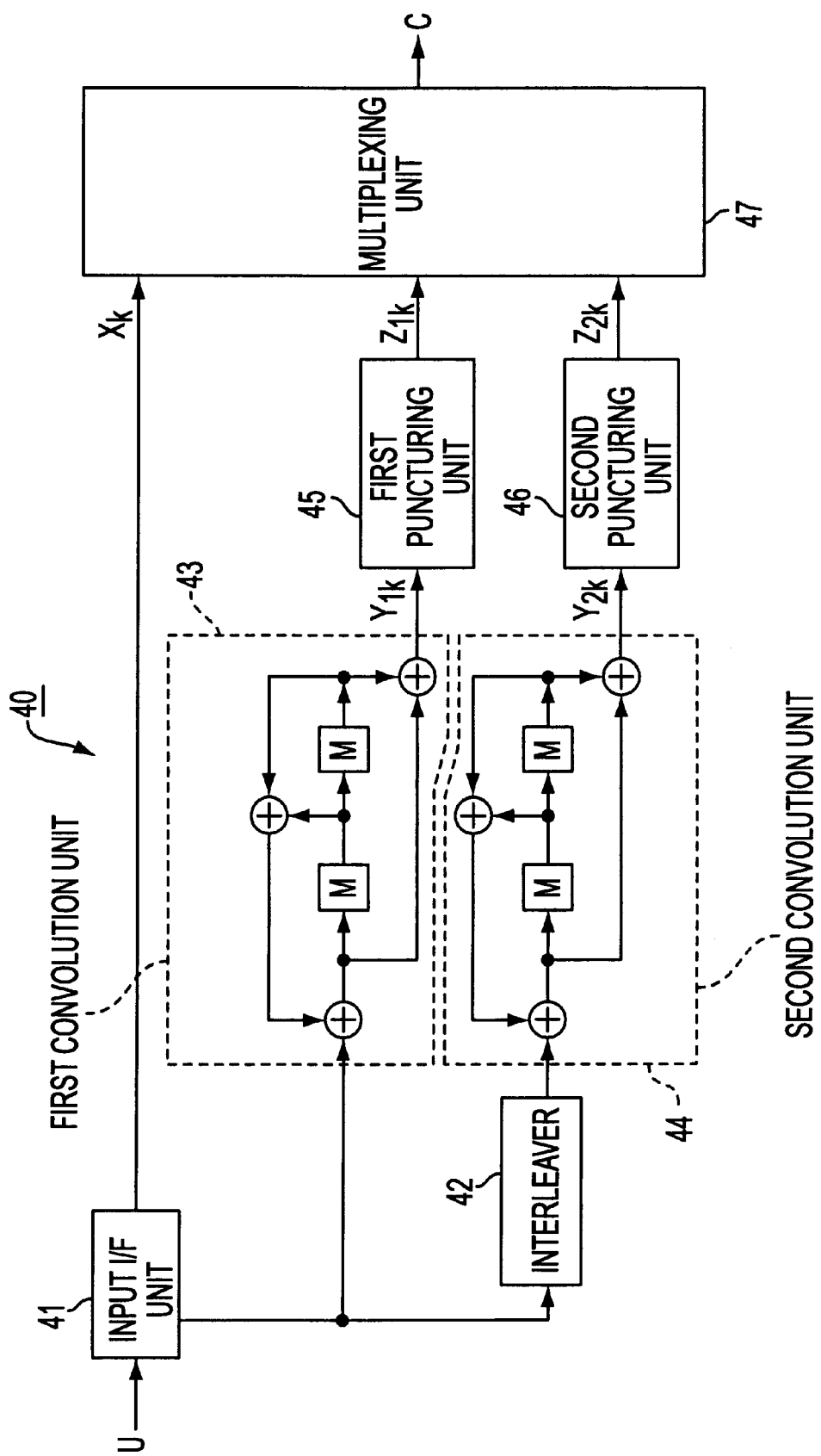
FIG. 3 is a block diagram showing an error-correcting encoding apparatus according to an embodiment of the present invention.

FIG. 3 is a block diagram showing an error-correcting encoding apparatus according to an embodiment of the present invention. The basic configuration of the error-correcting encoding apparatus is the same as that of the conventional error-correcting encoding apparatus shown in FIG. 21. However, the present invention includes puncturing units 45, 46 instead of selection unit 511 of the conventional error-correcting encoding apparatus shown in FIG. 21. The error-correcting encoding apparatus according to the present embodiment realizes a desired encoding rate through a puncturing process performed by the puncturing units 45,46. Described below are the configuration and the operations of the error-correcting encoding apparatus according to the present invention.

The error-correcting encoding apparatus 40 according to the present invention encodes source data u using a systematic code. In a systematic code, data to be transmitted is separate from the data for correcting errors (hereinafter referred to as "parity data") when it is generated during the transmission of the data. Thus, when the error-correcting encoding apparatus 40 receives source data u, it adds parity data Zk to the source data u and then transmits the encoded data. The error-correcting encoding apparatus 40 encodes N-bits of source data u. The error-correcting encoding apparatus 40 outputs the source data u as a data sequence Xk and the parity data as a parity data sequence Zk.

An input I/F unit 41 provides the received source data u to a multiplexing unit 47, a first convolution unit 43, and an interleaver 42. The source data u provided from the input I/F unit 41 to the multiplexing unit 47 is referred to as data sequence Xk.

The interleaver 42 randomizes the input source data u. The interleaver 42 contains memory for temporarily storing N-bits of source data u. The N-bits of source data u is written bit by bit to the memory. The data written to the memory is read out bit by bit in an order different from the order in which the data is written to the memory, thereby randomizing the source data u.

The interleaver 42 provides different and independent data sequences for the convolution units 43 and 44. Thus, although an interleaver is provided only before a second convolution unit 44 in FIG. 3, it can also be provided for both the first convolution unit 43 and the second convolution unit 44. In this case, the randomizing processes performed by the two interleavers would have to be different from each other.

The first convolution unit 43 performs a convoluting process on the input source data u. The second convolution unit 44 performs a convoluting process on the source data u randomized by the interleaver 42. The first convolution unit 43 and the second convolution unit 44 may have the same or different configurations. In the following explanation, it is assumed that the two convolution units 43 and 44 have the same configuration.

The first convolution unit 43 contains a plurality of memory units M connected in series with each other and one or more adders. Each memory unit M is, for example, a flip-flop, and stores 1-bit of data. The memory units M being serially connected to each other form part of a shift register. An adder can be, for example, an exclusive OR operation unit, a mod 2 adder, etc. With the configuration shown in FIG. 3, the first convolution unit 43 includes two memory units M and three adders. In this case, since the amount of data stored in the memory units M occupy 2 bits, the constraint length is 2. Therefore, the constraint length of the convolution unit equals the number of bits of data stored in the memory of the convolution unit.

Each time the first convolution unit 43 receives a data element of the source data u, it outputs a data element of the parity data sequence Y1k corresponding to the received data element. The data element of the parity data sequence Y1k is obtained as the sum of the data element newly input to the first convolution unit 43 and the data element stored in the memory M when the data element is input. Therefore, in this convoluting process, the data element corresponding to the newly input data element is generated and then output based on one or more previously input data elements and the newly input data element.

An initial value of "0" is set in each memory unit M of the first convolution unit 43. When a N-bit data sequence is input, the first convolution unit 43 outputs an N-bit parity data sequence, and then outputs a tail bit. The data length of the tail bit is, for example, equal to the number of the memory units M. In this example, it is 2.

The configuration and operation of the second convolution unit 44 are basically the same as those of the above-described first convolution unit 43. However, the second convolution unit 44 performs a convoluting process on the source data u randomized by the interleaver 42 to generate a parity data sequence Y2k. Since a convoluting process is conventional technology, and is well known to one of ordinary skill of the art, the detailed explanation is omitted here.

A first puncturing unit 45 selects each data elements of the parity data sequence Y1k generated by the first convolution unit 43 according to a predetermined pattern, and outputs a panty data sequence Z1k. Similarly, a second puncturing unit 46 selects data elements of the parity data sequence Y2k generated by the second convolution unit 44 according to a predetermined pattern, and outputs a parity data sequence Z2k. The feature of the error-correcting encoding apparatus 40 shown in FIG. 3 includes a method for selecting data elements by these puncturing units. The method of selecting data elements is described later in detail.

The multiplexing unit 47 multiplexes the data sequence Xk received from the input I/F unit 41, the parity data sequence Z1k received from the first puncturing unit 45, and the parity data sequence Z2k received from the second puncturing unit 46 to output the output sequence C. The output sequence C from the multiplexing unit 47 includes encoded data for the source data u. The multiplexing unit 47 has the function of adjusting the timing of the three input data sequences. Thus, when each data element of the source data u (data sequence Xk) is output, each data element of the parity data sequence Z1k and Z2k that corresponds to the data element of the source data u is output related to the data element of the source data.

Thus, when the source data u is input, the error-correcting encoding apparatus 40 adds the parity data sequences Z1k and Z2k for error correction to the data sequence Xk, which is the same data sequence as the source data u, and outputs the result.

Described below are the operations and the configurations of the first puncturing unit 45 and the second puncturing unit 46. In this case, it is assumed that the data length of the source data u is N bits and the data length of the output sequence C is M bits. Thus, the error-correcting encoding apparatus 40 has an encoding rate=N/M. The data lengths of the source data u and the output sequence C are, for example, determined by the specification of a communication. Especially, the data length of the output sequence C is determined by the format of the frame transmitted in the communication system.

Figure 4:
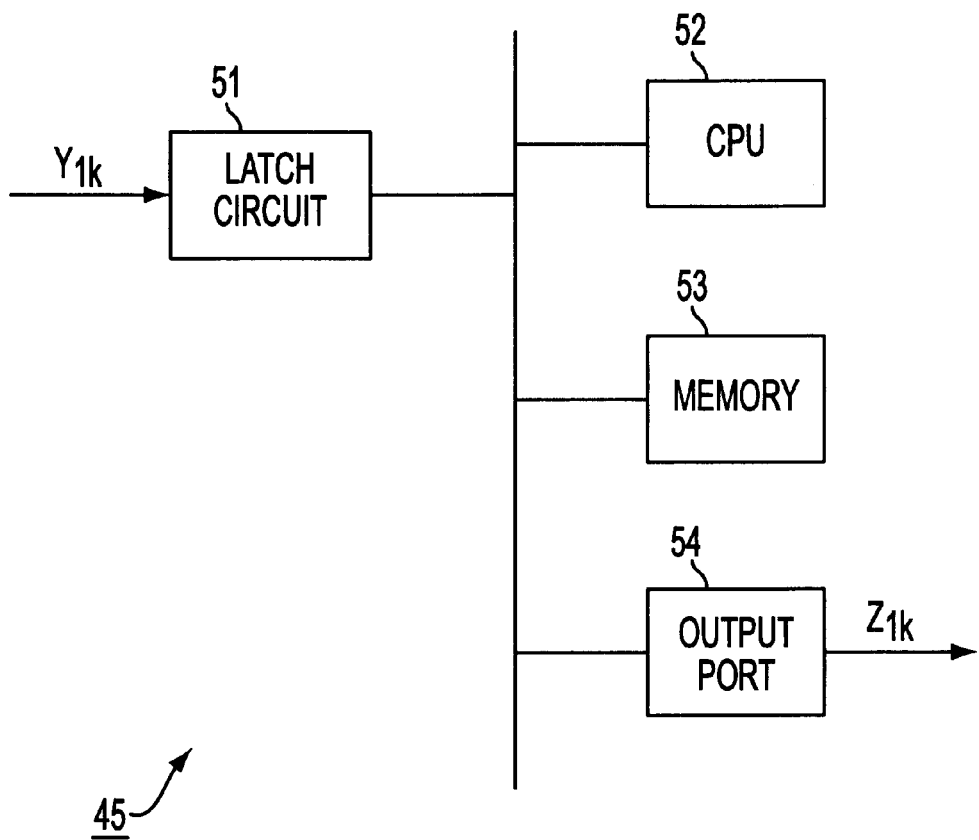
FIG. 4 is a block diagram of the puncturing unit.

FIG. 4 is a block diagram showing the first puncturing unit 45. The second puncturing unit 46 has basically the same configuration as the first puncturing unit 45. A latch circuit 51 holds bit by bit the parity data sequence Y1k output from the first convolution unit 43. Thus, the latch circuit 51 is updated each time a data element of the parity data sequence Y1k is output from the first convolution unit 43. A CPU 52 generates a data element of the parity data sequence Z1k from the data element stored in the latch circuit 51 by executing the program stored in memory 53. The data element of the parity data sequence Z1k is transmitted to the multiplexing unit 47 through an output port 54. The memory 53 stores a program to be executed by the CPU 52, and a puncturing table for use by the program. The program will be described in detail later.

FIG. 5 shows an example of a puncturing table. The puncturing table stores selection information (puncturing pattern information) indicating whether or not a data element of the parity data sequence Y1k is selected. Thus, the data length of the selection information is equal to the data length of the output data sequence from the first convolution unit 43. The first convolution unit 43 outputs a N-bit parity data sequence Z1k when the data length of the source data u is N bits. Therefore, the length of the selection information is also N bits.

When the first convolution unit 43 receives the source data u, it outputs the parity data sequence Y1k, and then outputs a tail bit. However, the puncturing process is not performed on the tail bit. That is, the tail bit is transmitted to the multiplexing unit 47 without being input to the puncturing unit.

In FIG. 5, the selection information=0 indicates that a parity data element is not selected, and the selection information=1 indicates that an parity data element is selected. For example, according to the selection information shown in FIG. 5, the second, fourth, fifth, . . . , the Nth data element is selected from an input data sequence. Thus, when a puncturing process is performed using the puncturing table, Y12, Y14, Y15, . . . are selected if the parity data sequences Y1k=Y11, Y12, Y13, Y14, Y15, . . . are sequentially input.

The second puncturing unit 46 is basically the same as the first puncturing unit 45. The puncturing table provided in the second puncturing unit 46 is basically the same puncturing table provided in the second puncturing unit 46. However, the selection information included in these two tables may be the same or different.

The CPU 52 and the memory 53 shown in FIG. 4 may be shared between the first puncturing unit 45 and the second puncturing unit 46. Furthermore, a puncturing pattern may be prepared as selection information to be shared between the first puncturing unit 45 and the second puncturing unit 46.

Further, the puncturing table is stored in the RAM area of the memory 53. Thus, selection information can be altered as necessary, enabling a desired encoding rate to be obtained. Furthermore, the data length of the selection information can be altered depending on the data length of source data or the data length of an output sequence from a convolution unit.

Described below is a method of generating a puncturing table (that is, the method of generating selection information). It is assumed in the following description, that the data length of the source data u is N bits and the data length of the output sequence C is M bits. In this case, the encoding rate of R=N/M is requested. Since the data lengths of the tail bits respectively generated by the first convolution unit 43 and the second convolution unit 44 are much shorter than the data length of the source data u, such bits are ignored in the following description.

When the data length of the source data u is N-bits, the data lengths of the data sequence Xk, the parity data sequence Y1k generated by the first convolution unit 43 and the parity data sequence Y2k generated by the second convolution unit 44 are also N-bits. Therefore, to set the data length of the output sequence C to M bits, the following equation is true when the data lengths of the parity data sequence Z1k and Z2k respectively are K1 and K2.

$$N+K1+K2=M$$

The following equation is obtained if K1=K2=K.

$$K=(M-N)/2$$

(where M>N, N>K)

In this case, the first puncturing unit 45 selects K data elements from the parity data sequence Y1k comprising N data elements and outputs the selected bits as the parity data sequence Z1k. Similarly, the second puncturing unit 46 selects K data elements from the parity data sequence Y2k comprising N data elements, and outputs the selected bits as the parity data sequence Z2k.

The puncturing table is used when K data elements are selected from N data elements. The selection information stored in the puncturing table indicates whether or not each data element of an input sequence is selected, as described above. Therefore, to select K data elements, K bits in the N-bit selection information is assigned 1 (select), and the other bits are assigned 0 (not select). Described below is a practical example of the method of assigning "1" to K bits of the N bits.

A plurality of seed sequences k/n are generated. The k/n is an n-bit sequence to which k 1's are equally assigned (k=1, 2, 3, . . . ; n=1, 2, 3, . . . ; and n>k). For example, a seed sequence is generated with 10 defined as the maximum value of n, and 9 defined as the maximum value of k. A part of a seed sequence is shown below, where "0" is assigned to the leading bit of each seed sequence.

K/n=2/7: (0001001)

1/3: (001)
3/8: (00100101)
2/5: (00101)
3/7: (0010101)
4/9: (001010101)
5/9: (010101011)
1/2: (01)
4/7: (0110101)
3/5: (01101)
5/8: (01110101)
3/4: (0111)
4/5: (01111)
5/6: (011111)

The optimum seed sequence is selected. Practically, k/n is determined in a way that the minimum value of r can be obtained by the following equation under the condition of K/N≧k/n.

$$r = \min \frac{K}{N} - \frac{k}{n}$$

where $$\frac{K}{N} \geq \frac{k}{n}$$

For example, when the data length N of the source data u is 300 elements, and 155 data elements are selected from 300 data elements in the puncturing process, 1/2 is obtained as k/n by substituting 155/300 for K/N. In this case, r=0.01666 is also obtained.

A base pattern of selection information to be written to the puncturing table is generated used the seed sequence selected above. Practically, a base pattern having the data length of N is generated by repeating the selected seed sequence. For example, when a seed sequence of k/n=1/2 is selected, a 300-bit base pattern is obtained by repeating the seed sequence (01) as described in the example above.

Selection information is obtained by amending a base pattern. Practically, A=r N is first computed. Then, in the base pattern described above, the number of "0" corresponding to A are evenly selected and replaced with 1's. The leading bit of the base pattern is not replaced. For example, since A=0.166×300=5 is obtained in the example above, five 0's are replaced with 1's in the base pattern (01010101 . . . 0101).

The pattern obtained in the above-described process is stored in the puncturing table as selection information (puncturing pattern information).

The puncturing tables provided in the first puncturing unit 45 and the second puncturing unit 46 are the same as each other in one embodiment of the present invention. However, the two tables do not have to be always the same as each other. However, it is preferred that the numbers of 1's contained in the selection information stored in the two tables are equal or very close to each other. When the numbers of 1's contained in the selection information are quite different from each other, a poor decoding characteristic may be obtained.

The leading bit of the selection information is set to 0 for the following reason. That is, the leading bit of the selection information indicates whether or not the leading data element of the parity data sequence Y1k generated by the first convolution unit 43 (or the parity data sequence Y2k generated by the second convolution unit 44) is to be selected. The leading data element of the parity data sequence Y1k is generated in the first convolution unit 43 by adding the leading data element of the source data u to the initial value stored in the memory M shown in FIG. 3. However, since the initial value is generally "0", the leading data element of the parity data sequence Y1k is the leading data element of the source data u itself. That is, there is no effects of a convoluting process. Therefore, the error correcting capability cannot be improved in the decoding process even if the data element of the parity data sequence Y1k is selected and transmitted to a receiving device after assigning a "1" to the leading bit of the selection information.

Therefore, according to the present invention, the error correcting capability is improved in the decoding process by assigning 1 to the selection information to select a data element other than the leading data element.

Described below is the puncturing process performed using a puncturing table. The first puncturing unit 45 refers to a puncturing table each time it receives a data element of the parity data sequence Y1k, and determines whether or not the data element is to be selected. The selected data element is transmitted to the multiplexing unit 47 as a parity data sequence Z1k. On the other hand, when a data element is not selected, it is discarded without being transmitted to the multiplexing unit 47. This process is the same as the process in the second puncturing unit 46.

Figure 6:
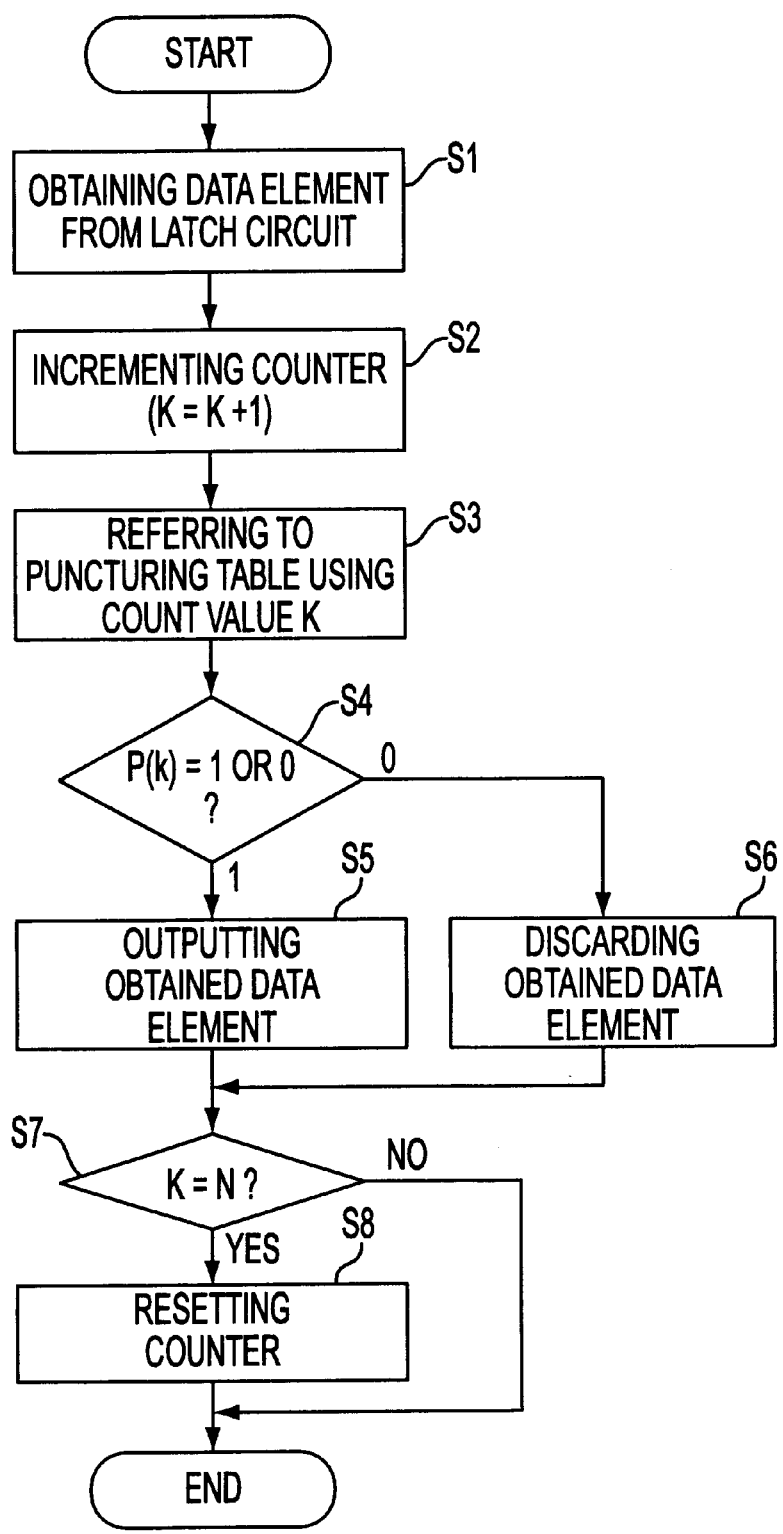
FIG. 6 is a flowchart of the puncturing process.

FIG. 6 is a flowchart of the puncturing process. This process is performed each time the data element of the parity data sequence Yk generated by the convolution unit is written to the latch circuit 51. The parity data sequence Yk indicates the parity data sequence Y1k or Y2k. In other words, the process according to this flowchart shows the operation of the first puncturing unit 45. When Yk=Y1k. Further, the process according to this flowchart shows the operation of the second puncturing unit 46 when Yk=Y2k.

In step S1, a data element is obtained from the latch circuit 51. In step S2, the counter for counting the order, in the parity data sequence Yk, of the data element written to the latch circuit 51 is incremented. The count value k corresponds to the position information about the data element or its sequence number. The counter is reset each time a process is completed on a set of source data.

In step S3, the puncturing table shown in FIG. 5 is checked using the count value k of the above described counter. Thus, the selection information P(k) regarding the data element written to the latch circuit 51 is obtained. In step S4, it is checked whether the selection information P(k) obtained in step S3 is "1" or "0". If the selection information P(k)=1, then the data element written to the latch circuit 51 is transmitted to the multiplexing unit 47 through the output port 54 in step S5. At this time, the count value k used when the puncturing table is checked is also transmitted to the multiplexing unit 47. On the other hand, if the selection information P(k)=0, then the data element written to the latch circuit 51 is discarded in step S6.

In step S7, it is checked whether or not the count value k has reached N. If the count value K has reached N, then it is assumed that the process on a set of source data has been completed, and the counter is reset in step S8.

Thus, the first puncturing unit 45 and the second puncturing unit 46 selects K bits from the input N-bit parity data sequence Yk and outputs the selected bits. This selecting process is realized by the CPU 52 executing the program describing the steps S1 through S8.

Table 2 shows an example of the output from the first puncturing unit 45 and the second puncturing unit 46.

TABLE 2

| $y_1(3)$ | $y_1(4)$ | $y_1(6)$ | $y_1(9)$ |
|---|---|---|---|
| $y_2(3)$ | $y_2(4)$ | $y_2(6)$ | $y_2(9)$ |

The output is obtained when the input source data u is 9-bit data, and both puncturing patterns P in the first puncturing unit 45 and the second puncturing unit 46 are (0 0 1 1 0 1 0 0 1).

Figure 7:
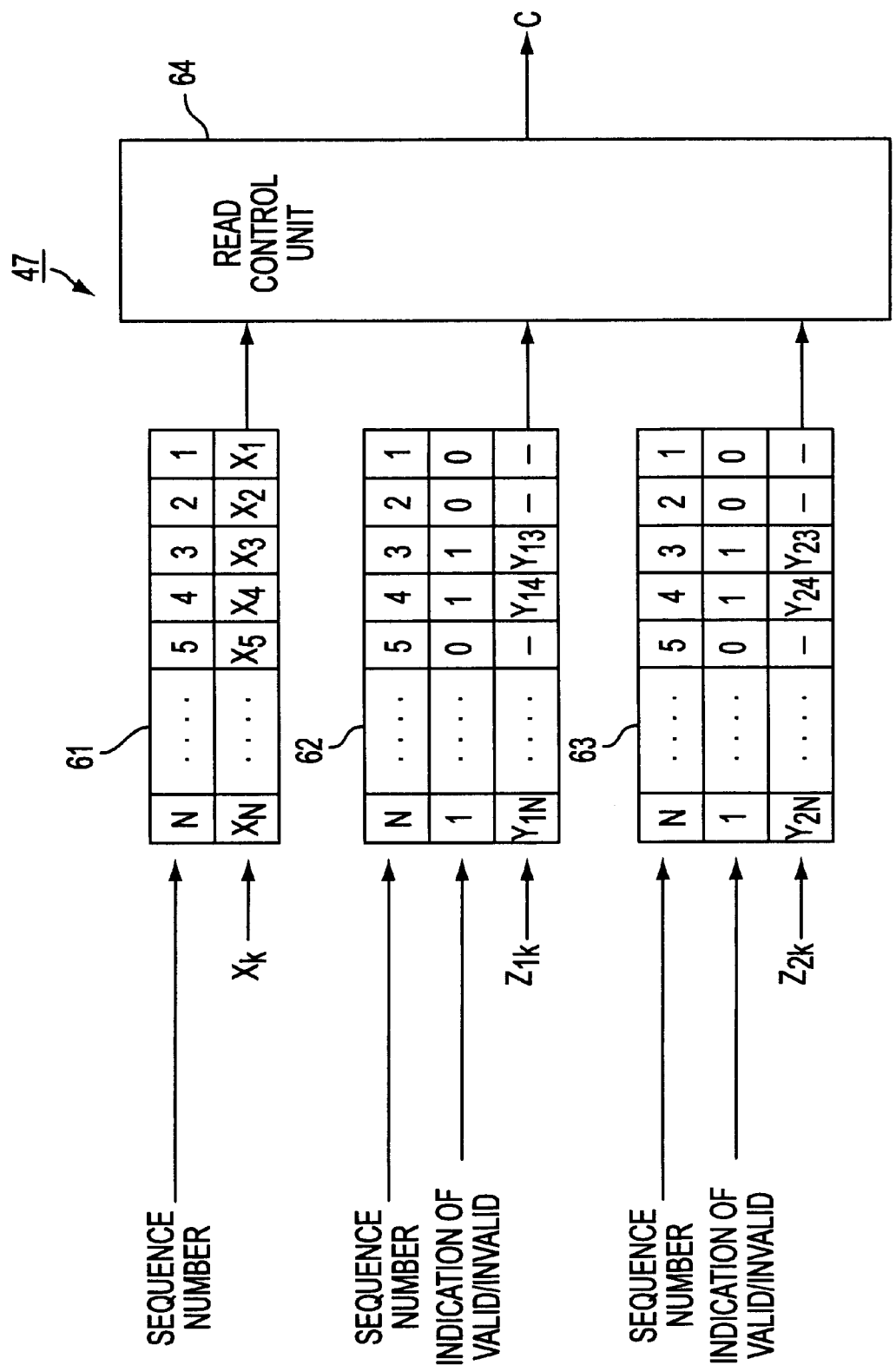
FIG. 7 is a block diagram of the multiplexing unit.

FIG. 7 is a block diagram showing the multiplexing unit 47. The multiplexing unit 47 includes a buffer 61 for storing the data sequence Xk, memory 62 for storing the parity data sequence Z1k generated by the first puncturing unit 45, memory 63 for storing the parity data sequence Z2k generated by the second puncturing unit 46 and a read control unit 64 for reading data elements from the memory 62,63, and outputting the read data element.

The data elements of the data sequence Xk are sequentially written to the buffer 61. The parity data sequence Z1k are the data elements selected by the first puncturing unit 45. These data elements are written to the memory 62 corresponding to the sequence numbers. The sequence number corresponding to each data element is, for example, indicated by the count value k of the counter described by referring to FIG. 6. In the memory 62, "valid" or "invalid" is set to indicate whether or not a data element is written corresponding to each sequence number. The configuration of the memory 63 is the same as that of the memory 62.

The read control unit 64 reads a data element from the buffer 61, the memory 62, or the other memory 63 at predetermined intervals, and outputs the selected data elements. Practically, the data element is read by repeatedly performing the following steps (1) through (4).

(1) Reading the data element having the sequence number specified by the buffer 61.
(2) Reading the data element having the specified sequence number if it is stored in the memory 62.
(3) Reading the data element having the specified sequence number if it is stored in the memory 63.
(4) Specifying, the next sequence number.

When the buffer 61, memories 62,63 are in the state shown in FIG. 7, the output sequence C is as follows by repeatedly performing the steps (1) through (4) above. That is, the output sequence C=(X1, X2, X3, Y23, X4, X14, Y14, Y24, X5, . . . ).

Thus, the error-correcting encoding apparatus 40 shown in FIG. 3 can change the amount of the parity data added for error correction using the selection information (puncturing pattern) stored in the puncturing unit. Therefore, a desired encoding rate R can be obtained based on the settings of the selection information.

Briefly described below is the decoding device for decoding a data sequence encoded by the error-correcting encoding apparatus 40. Various methods have been developed as decoding processes. However, this device basically decode data sequences by performing an encoding process in the inverse order.

Figure 8:
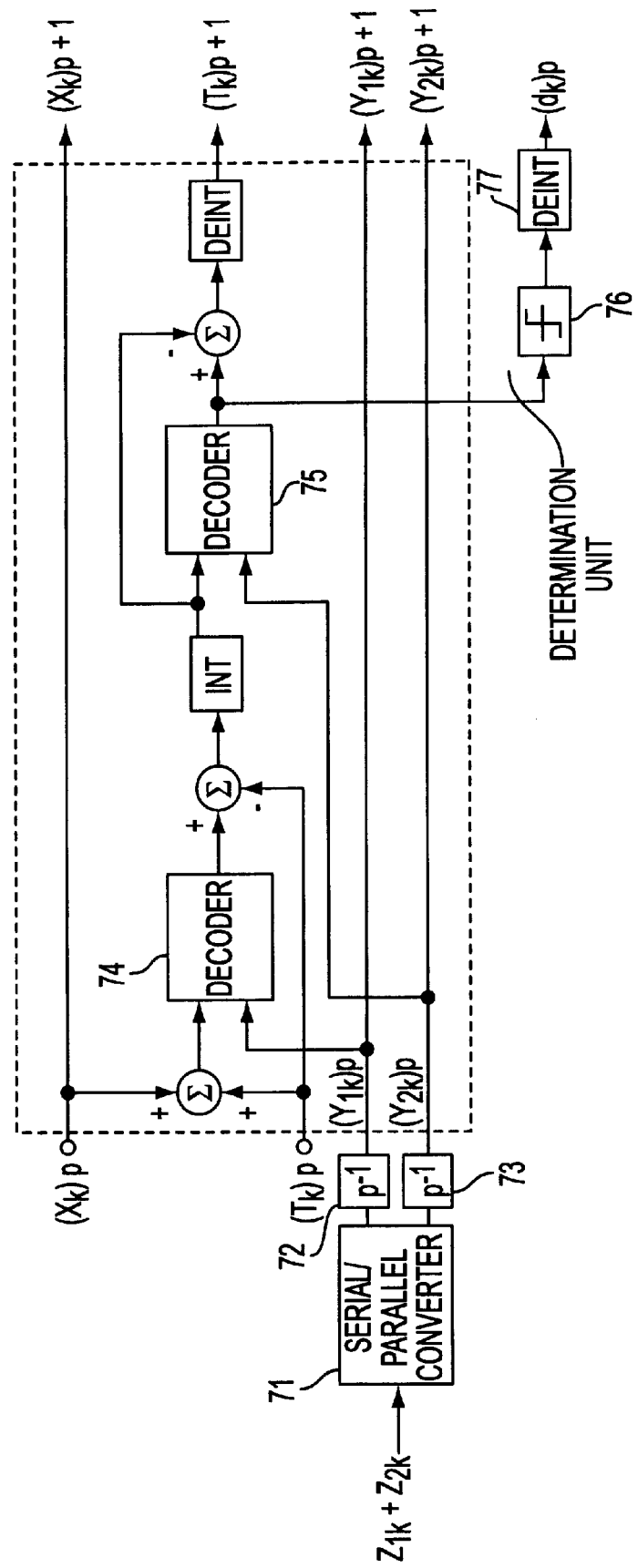
FIG. 8 is a block diagram of the decoding device.

FIG. 8 is a block diagram of a decoding device according to the present invention. It is assumed that the puncturing process is performed on the parity data sequences Y1k, Y2k respectively in the first puncturing unit 45 and the second puncturing unit 46 of the error-correcting encoding apparatus 40 using the same selection information. Although not shown in FIG. 8, the decoding device has the function of separating the data sequence X and the parity data sequence Z multiplexed in the error-correcting encoding apparatus 40.

A serial/parallel converter 71 separates the received parity data sequence Z into a parity data sequence Z1k and a parity data sequence Z2k. The parity data sequences Z1k and Z2k are sequences generated by the first puncturing unit 45 and the second puncturing unit 46 contained in the error-correcting encoding apparatus 40.

A first depuncturing unit (p−1) 72 and a second depuncturing unit (p−1) 73 contain the same puncturing tables as the error-correcting encoding apparatus 40, and perform the depuncturing process on the parity data sequences Z1k and Z2k.

Figure 9:
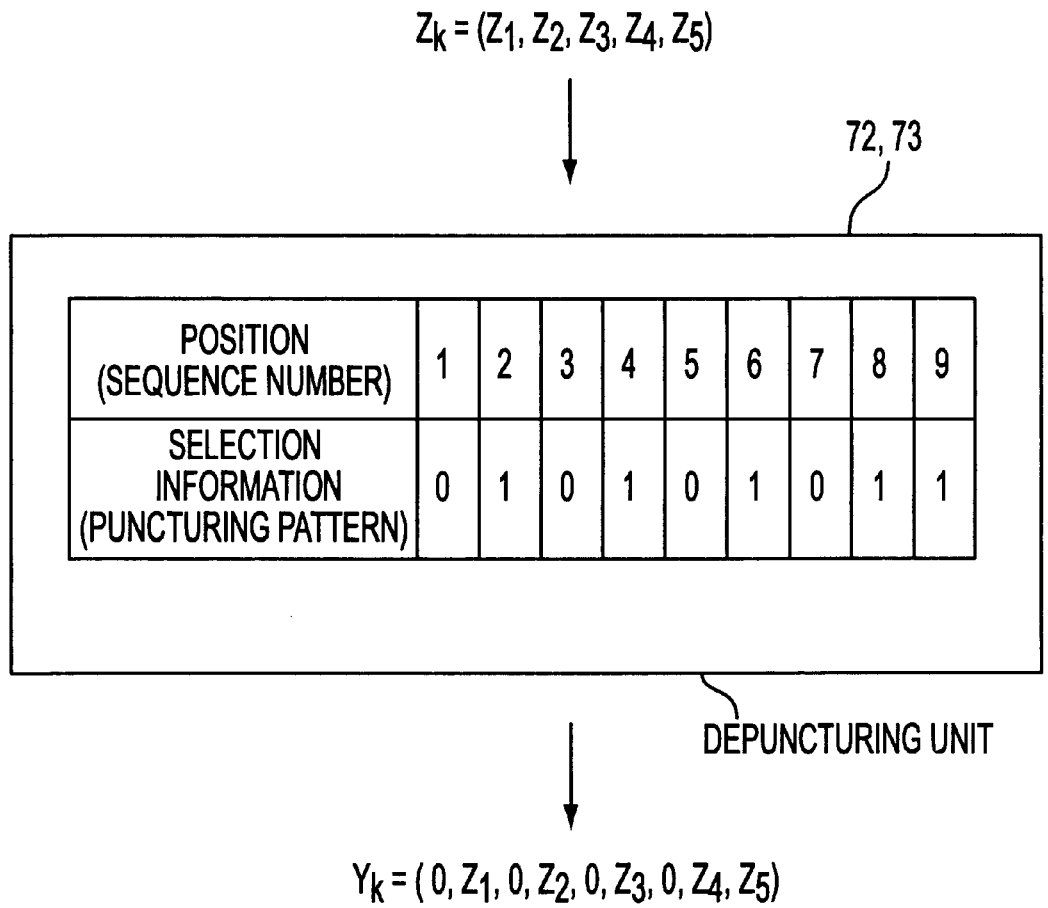
FIG. 9 shows depuncturing unit.

FIG. 9 shows an example of a depuncturing unit 72, 73 according to the present invention. In this example, it is assumed that the parity data sequence Z1k=(Z11, Z12, Z13, Z14, and Z15) has been input, and the puncturing table has stored the selection information shown in FIG. 10. Described below is the process performed by the first depuncturing unit 72, which is the same as the process performed by the second depuncturing unit 73.

When the first depuncturing unit 72 receives the parity data sequence Z1k, it first checks the selection information corresponding to the sequence number=1 in the puncturing table. Since the selection information=0 in this example, the first depuncturing unit 72 outputs a "0". It then checks the selection information corresponding to the sequence number=2 of the puncturing table. In this case, since the selection information=1, the first depuncturing unit 72 outputs Z11, that is, the leading data element of the parity data sequence Z1k. Similarly, the first depuncturing unit 72 outputs a "0" when the selection information=0, and sequentially outputs one by one the data element of the parity data sequence Z1k, when the selection information=1. As a result, the first depuncturing unit 72 outputs the following data sequences.

Output sequences: (0, Z11, 0, Z12, 0, Z13, 0, Z14, Z15).

Referring back to FIG. 8, the above sequence is provided as a parity data sequence Y1k for a first decoder 74. Similarly, the second depuncturing unit 73 generates a parity data sequence Y2k and provides it for a second decoder 75.

Figure 10:
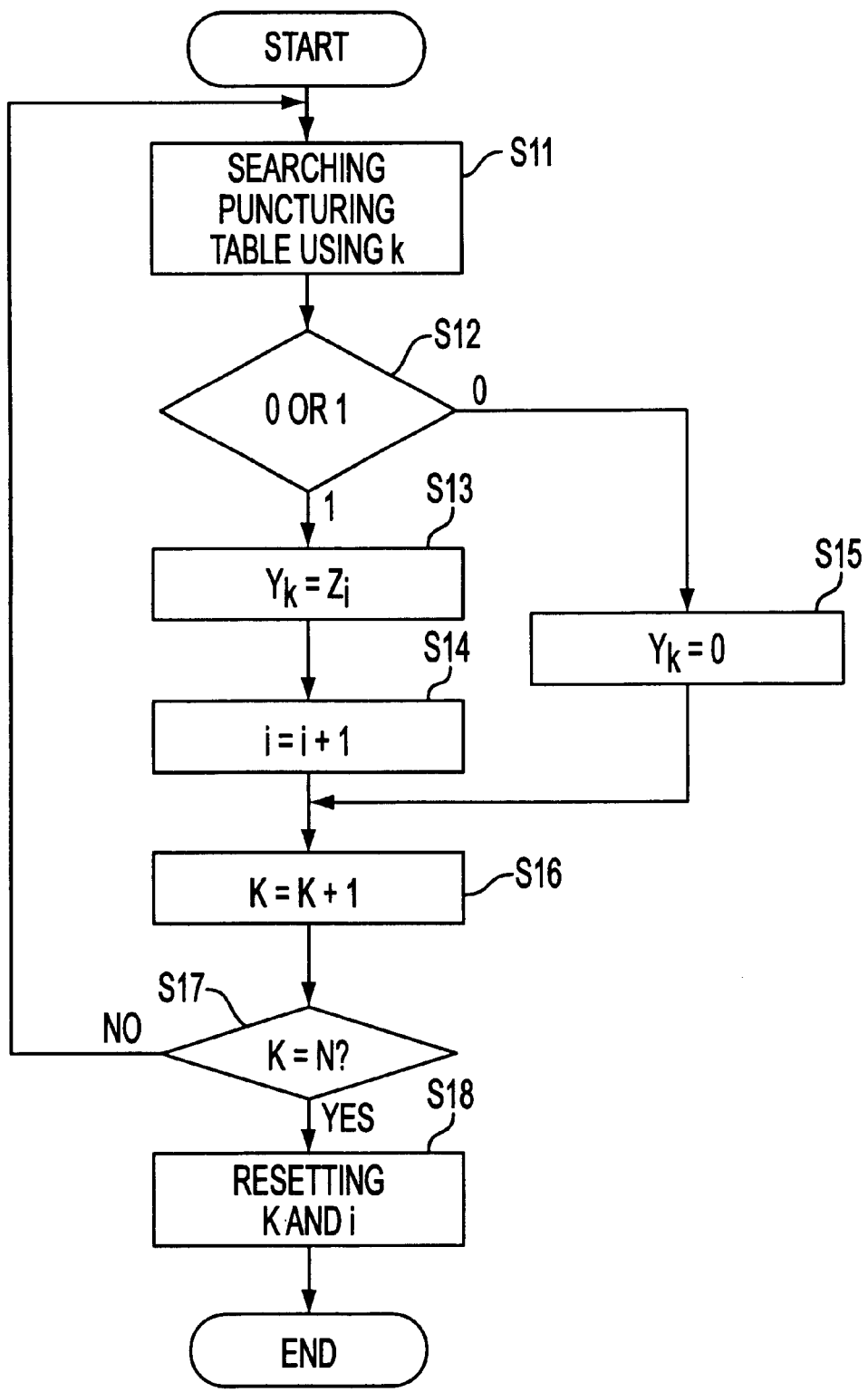
FIG. 10 is a flowchart of the depuncturing process.

FIG. 10 is a flowchart of the depuncturing process. In this example, a data sequence Y is generated for an input data sequence Z. The data elements of the data sequences Z and Y are respectively represented by Zi and Yk.

In step S11, the puncturing table is searched using k to obtain corresponding selection information. In particular, selection information of the kth position is obtained. In step S12, it is checked whether the selection information obtained in step S11 is "1" or "0". If the obtained selection information is a "1", one of the data elements of the data sequence Zi is output as a data element of the data sequence Yk in step S13. Then, in step S14, I is incremented. On the other hand, if the obtained selection information is a "0", then "0" is output as a data element of the data sequence Yk in step S15.

In step S16, k is then incremented. In step S17, it is checked whether or not k has reached N, where N indicates the data length of the source data. Unless k has reached N, control is returned to step S11. If k has reached N, then k and I are reset.

Referring again to FIG. 8, the parity data sequence Y1k generated by the first depuncturing unit 72 is provided for the first decoder 74. Similarly, the parity data sequence Y2k generated by the second depuncturing unit 73 is provided for the second decoder 75. The first decoder 74 decodes the data sequence Xk received using the parity data sequence Y1k. The second decoder 75 decodes the output from the first decoder 74 using the parity data sequence Y2k.

The output from the second decoder 75 is compared with a predetermined threshold by a determination unit 76. A deinterleaver 77 then performs a deinterleaving process (a process for performing the randomizing process by the error-correcting encoding apparatus 40 in the inverse order) on the comparison result, and the result is output as decoded data.

The decoding process excluding the process of generating a parity data sequence can be realized using conventional technology. For example, it is described in the U.S. Pat. No. 5,446,747. Therefore, the detailed explanation about the decoding process is omitted here.

Figure 11:
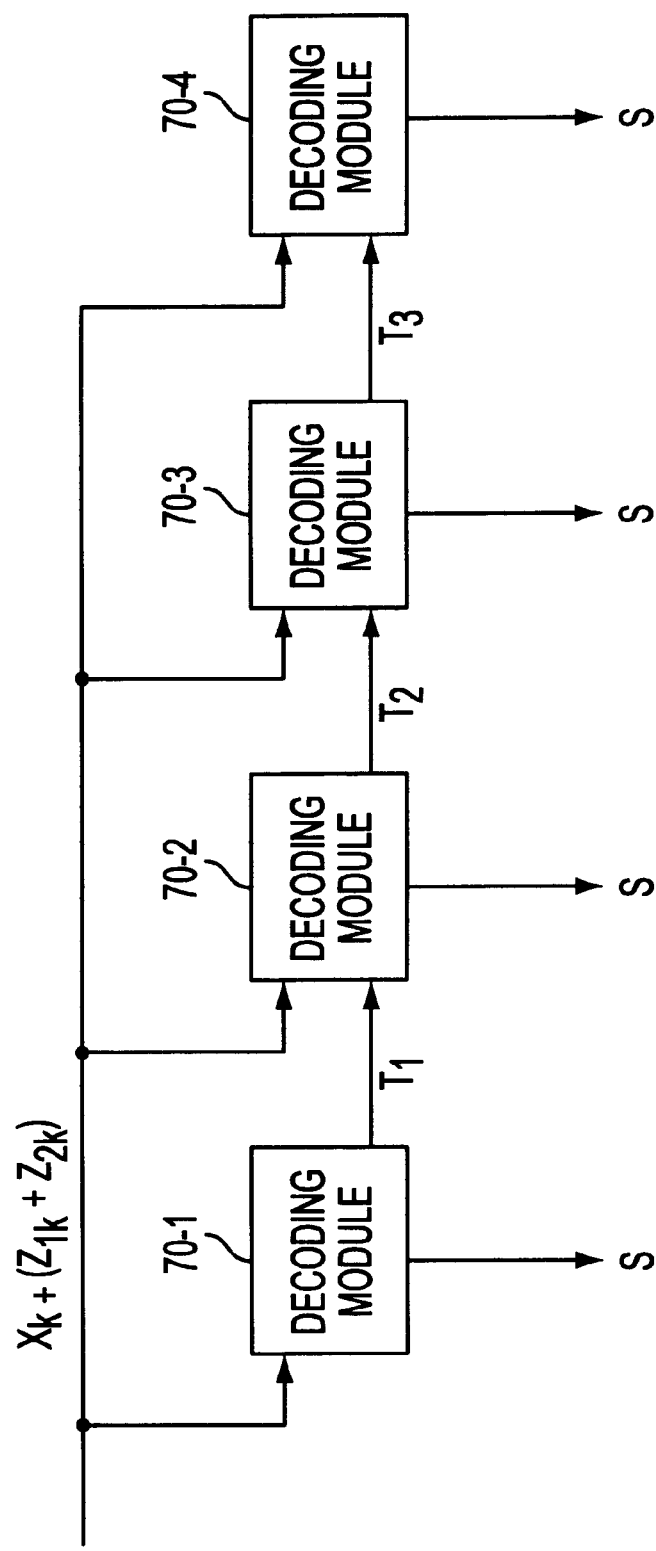
FIG. 11 is a block diagram showing an example of the decoding device with improved decoding precision.

To improve the decoding precision, the decoding device with the above described configuration can be serially connected as shown in FIG. 11. In this case, the decoding device shown in FIG. 8 corresponds to one decoding module. Each decoding module receives a reception data sequence (data sequence Xk to be decoded and parity data sequence (Z1k+Z2k)), and a predicted value (sequence T) of the data sequence from the previous decoding module. Each decoding module also generates decoded data S, which is a newly predicted data sequence. The newly predicted data sequence X is then transmitted to the subsequent decoding module.

With the above-described configuration, the decoding precision can be improved by increasing the number of serially connected decoding modules. For example, the decoding precision of the decoded data S output from a decoding module 70-4 is higher than that of the decoded data S output from the decoding module 70-1. The operation with the configuration is described in the U.S. Pat. No. 5,446,747.

With the configuration shown in FIG. 11, the serial/parallel converter 71, the first depuncturing unit 72, and the second depuncturing unit 73 shown in FIG. 8 can be provided for the first decoding module 70-1.

Figure 20:
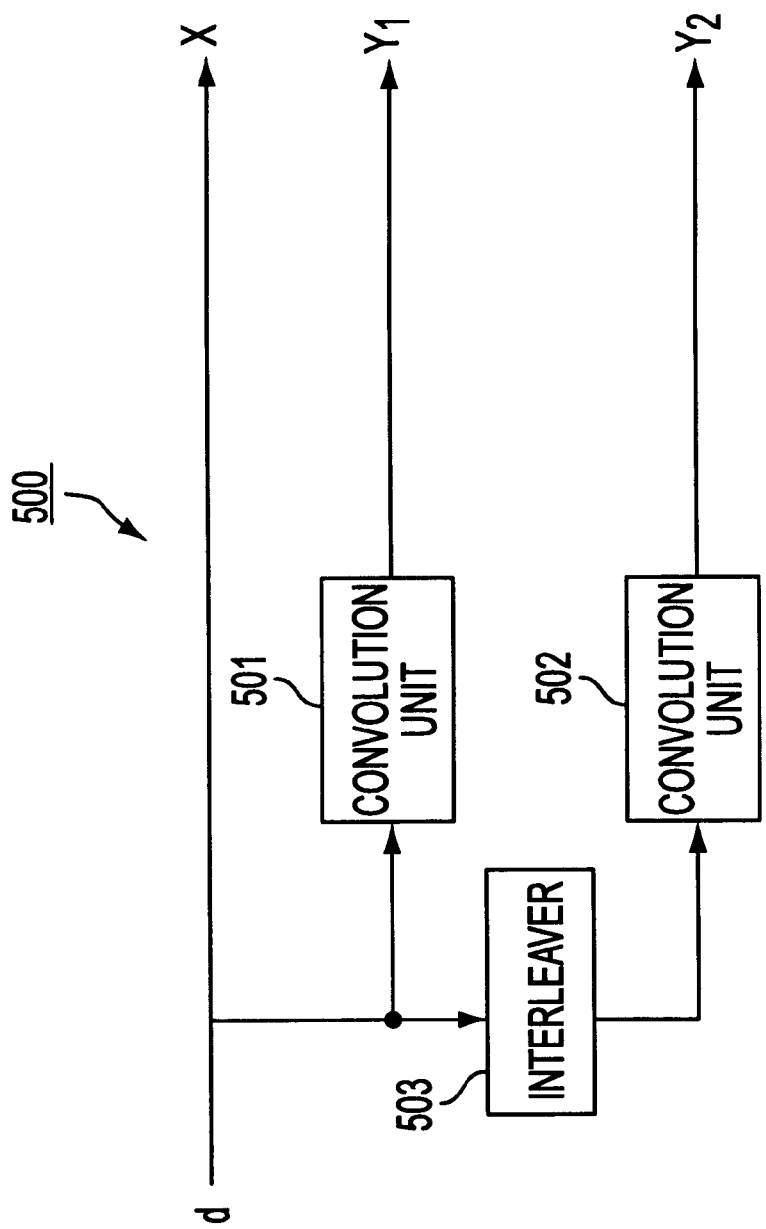
FIG. 20 is a block diagram showing an example of an existing error-correcting encoding apparatus using a convolutional code.

Described below is the error-correcting encoding apparatus according to another embodiment of the present invention. The conventional error-correcting encoding apparatus is normally assigned a fixed encoding rate. For example, with the configuration shown in FIG. 20, the encoding rate R=1/3. With the configuration shown in FIG. 21, the encoding rate=1/2. In the error-correcting encoding apparatus described below can use an optional encoding rate. Especially, an optional encoding rate lower than 1/3 can be obtained.

Figure 12:
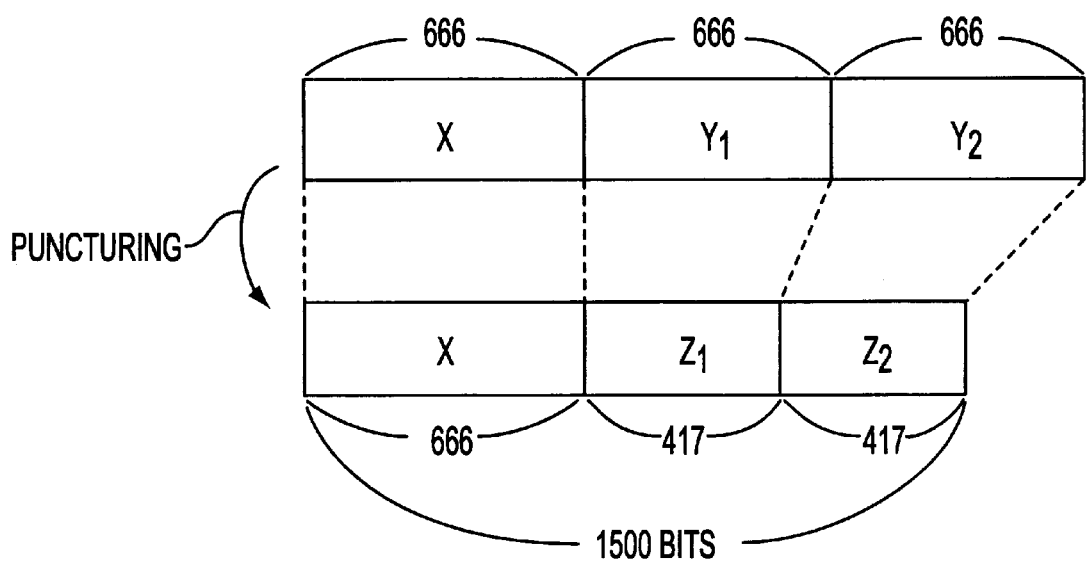
FIG. 12 is a diagram showing the difference in output between the error-correcting encoding apparatus according to the present embodiment and the conventional apparatus.
Figure 21:
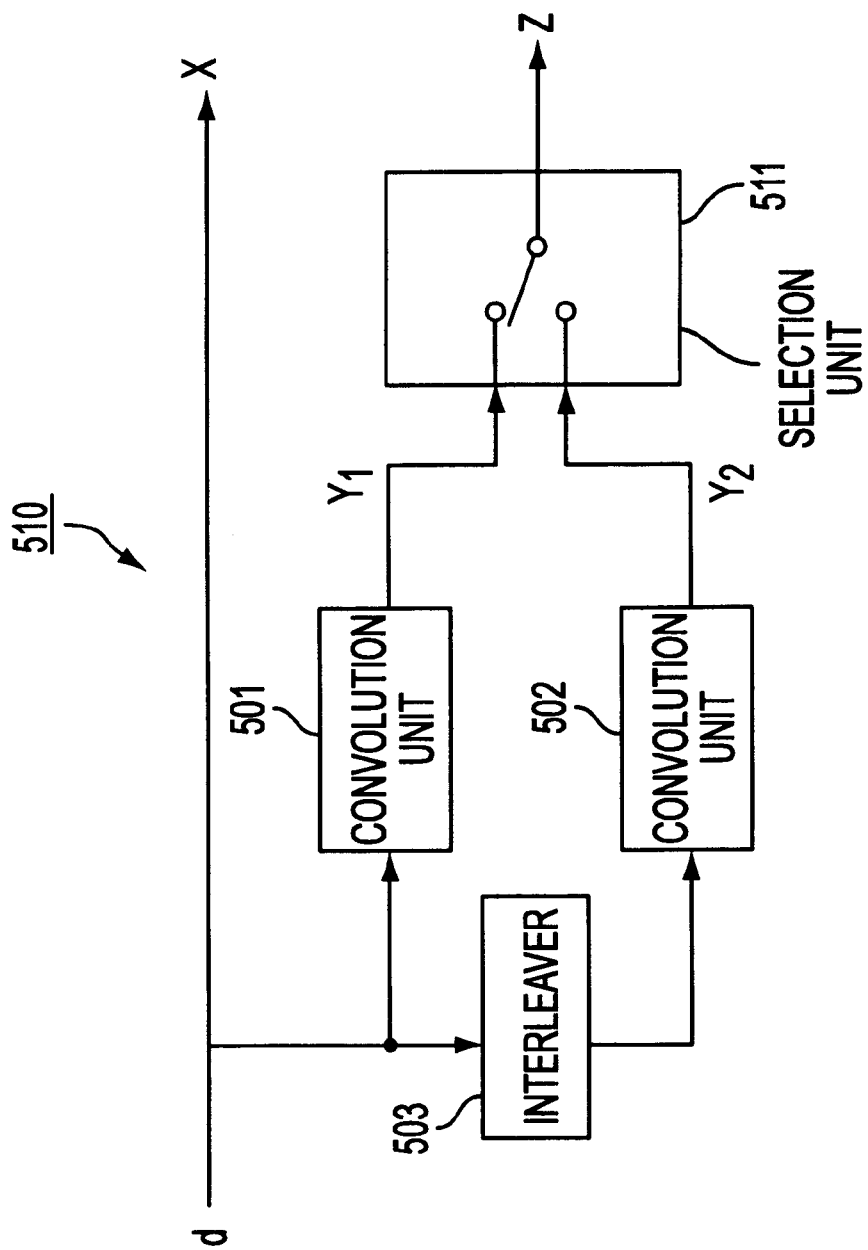
FIG. 21 is a block diagram showing an example of a variation of the error-correcting encoding apparatus shown in FIG. 20.
Figure 23A:
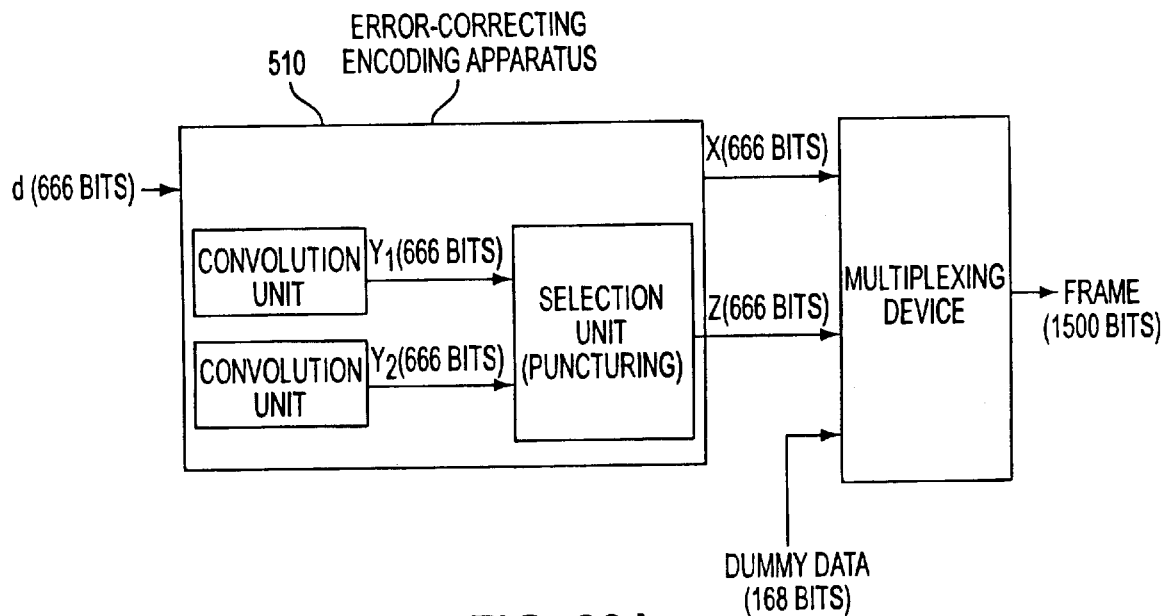
FIG. 23A is a diagram showing the process of encoding source data using the error-correcting encoding apparatus shown in FIG. 21 and storing the encoded data in a frame of a fixed length.
Figure 23B:
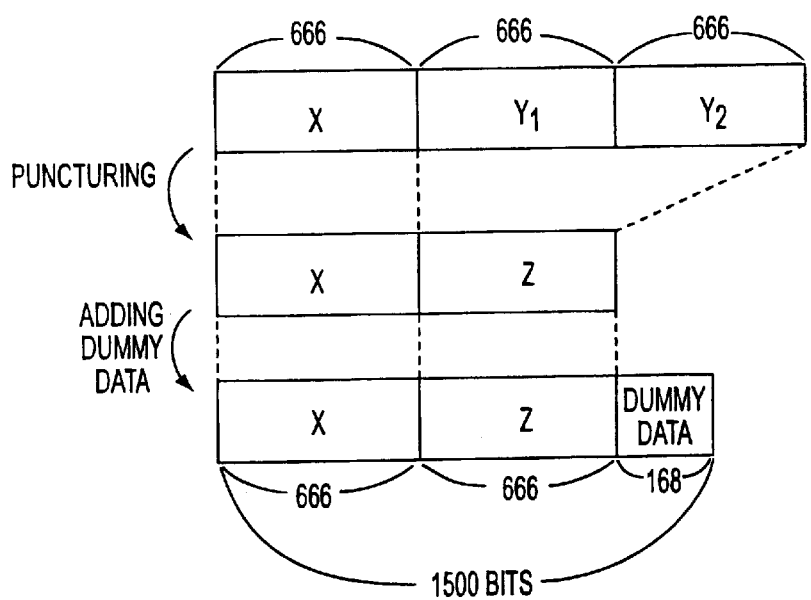
FIG. 23B shows a type of data stored in the frame.

FIG. 12 shows the difference in output between the error-correcting encoding apparatus 40 according to the present embodiment and the conventional apparatus. In the following explanation, the apparatus shown in FIG. 21 is referred to. In the conventional apparatus, as described by referring to FIG. 23, 168-bit dummy data is assigned to the encoded data, for example, when the data length of the source data is 666 bits while the required output data length is 1500 bits. In this case, the parity data used for correction of an error is 666 bits long.

In contrast, when the error-correcting encoding apparatus 40 is used, 417-bit parity data sequences Z1k,Z2k are generated respectively from the 666-bit parity data sequences Y1k,Y2k as shown in FIG. 12. As a result, the parity data for use in correcting an error is 834 bits long. That is, the amount of data used for error correction is larger than the amount of data used in the conventional apparatus. As a result, the present embodiment has a high decoding capability.

Figure 13:
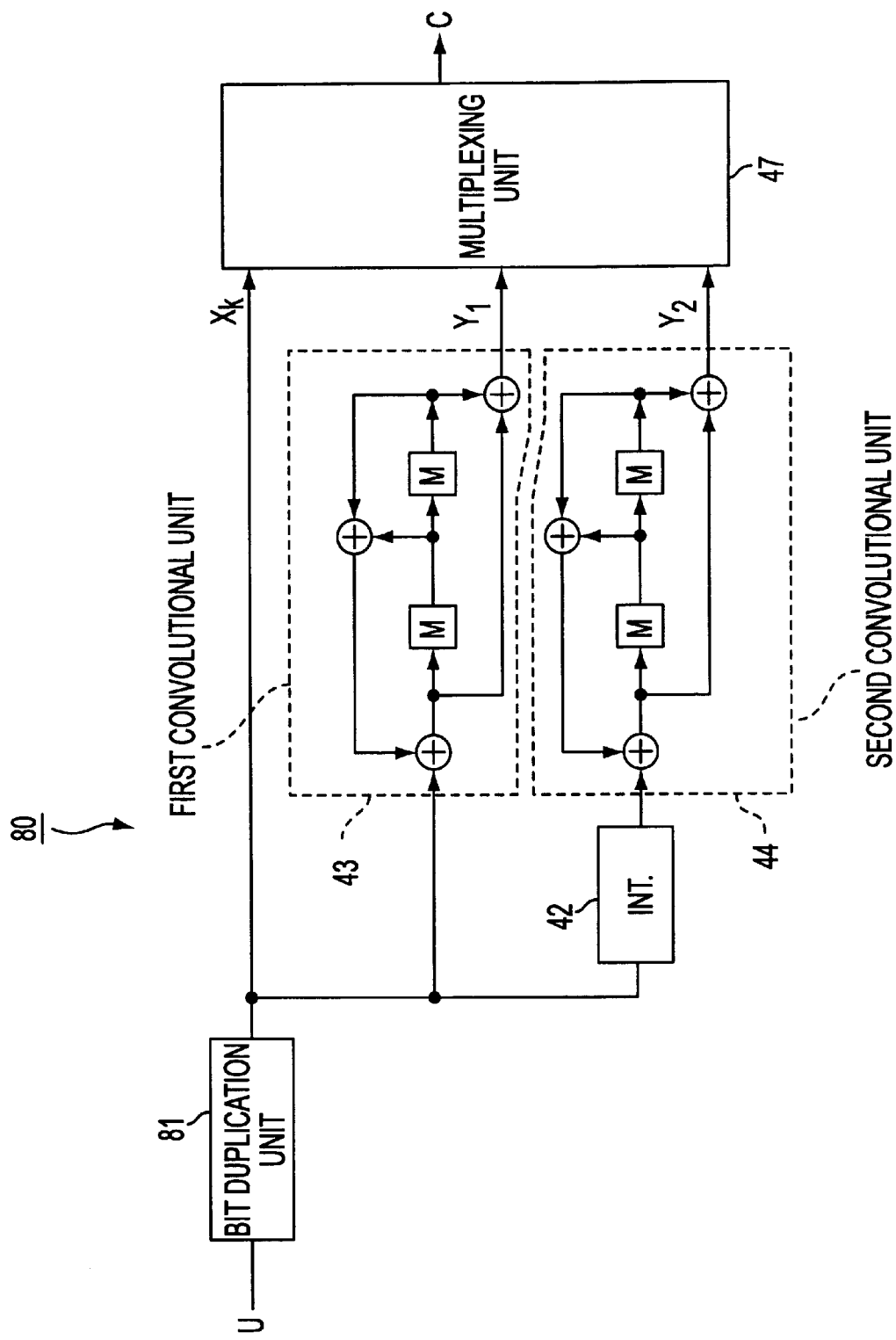
FIG. 13 is a block diagram showing an error-correcting encoding apparatus according to another embodiment of the present invention.

FIG. 13 shows an error-correcting encoding apparatus 80 according to another embodiment of the present invention. In FIG. 13, the interleaver 42, the first convolution unit 43, the second convolution unit 44, and the multiplexing unit 47 are the same as those shown in FIG. 3. However, FIG. 13, the input I/F unit 41 is omitted.

The error-correcting encoding apparatus 80 according to the embodiment includes a bit duplication unit 81. The bit duplication unit 81 duplicates a predetermined number of data elements in the source data u to obtain a desired encoding rate.

The operation of the bit duplication unit 81 is described below. In the following descriptions, it is assumed that the data length of the source data u is N bits, and the data length of the output data sequence C is M bits. It is also assumed that M>3N. In other words, it is assumed that an encoding rate lower than 1/3 is requested.

Assuming that the data sequence Xk is obtained by duplicating r-bits of data in the source data u the bit duplication unit 81, each data length of the data sequence Xk, the parity data sequence Y1k, and the parity data sequence Y2k is "N+r". Therefore, to set the data length of an output data sequence to M bits, the number of bits to be duplicated by the bit duplication unit 81 is obtained by the following equation.

$$(N+r) \times 3 = M$$

$$\therefore r = M/3 - N$$

For example, assuming that the data length of the source data u is 250 bits and the data length of a desired output sequence is 900 bits, R=50 is obtained by substituting N=250 and M=900 in the equation above.

It is desired that the bit duplication unit 81 duplicates the data elements of the source data u for every "constraint length+1". The constraint length refers to the number of bits of data stored in the memory for a convoluting process. For example, with the configuration shown in FIG. 13, the constraint length=2. Therefore, the data elements of the source data u are duplicated for every 3 bits.

Thus, when a data sequence whose predetermined number of data elements are duplicated is encoded and transmitted, the precision of a decoding process for the subsequent data elements after the duplication of the data elements can be improved.

FIG. 14 shows an example of the operation performed by the bit duplication unit 81. In this example, the data length of the source data u is 7 bits, the constraint length is 2, and the data length of a requested output sequence is 27 bits. In this case, two data elements are duplicated. Furthermore, the data elements are duplicated for every 3 bits. In this process, the encoding rate of the error-correcting encoding apparatus 80 is 7/27.

Figure 15:
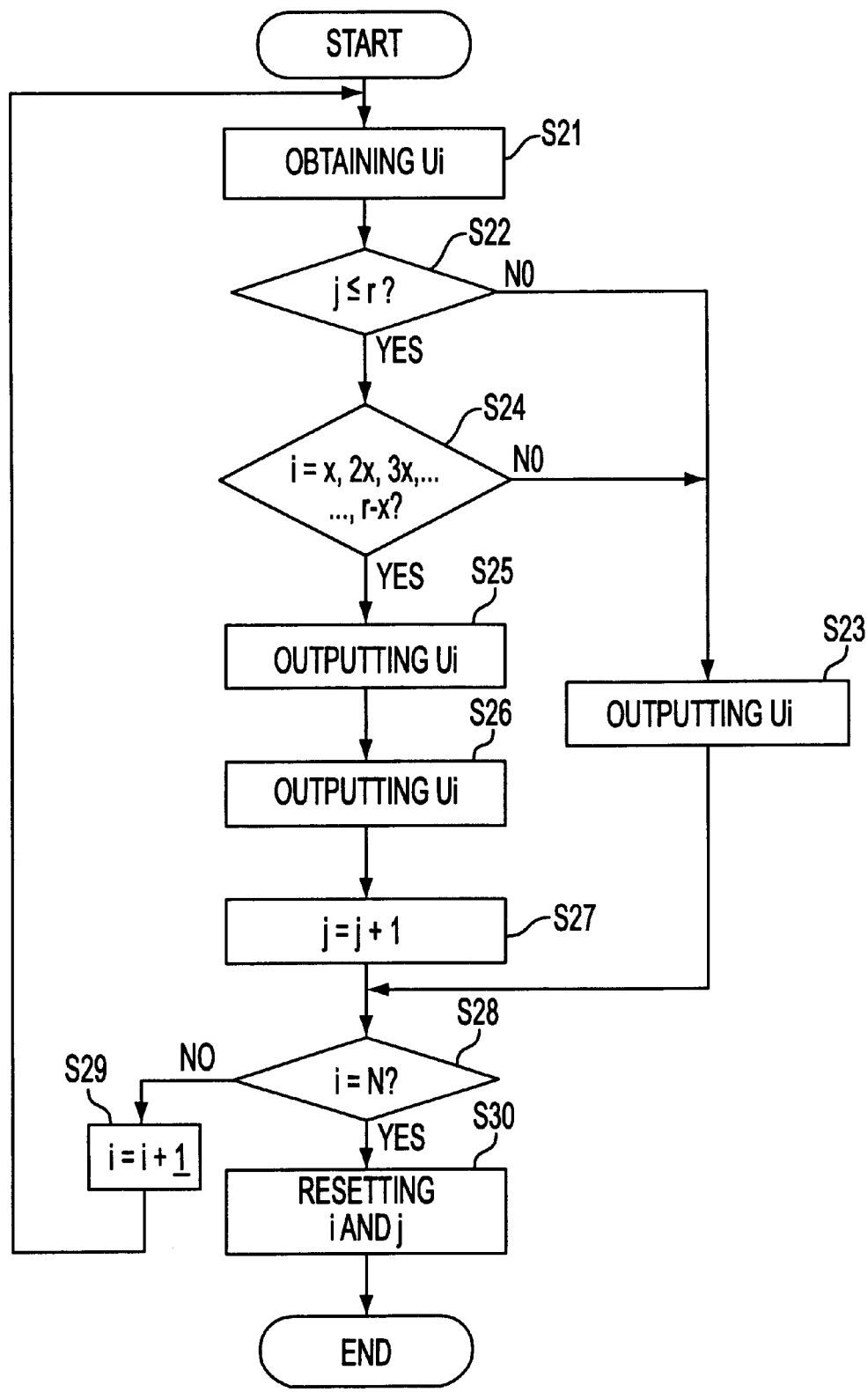
FIG. 15 is a flowchart of the operation of the bit duplication unit.

FIG. 15 is a flowchart of the operation of the bit duplication unit 81. In this example, the source data u (u0, u1, u2, u3, ..., ui, ...) is input. The number of data elements to be duplicated is r. Furthermore, the data elements are duplicated for every x bits.

In step S21, the data element ui of the source data u is obtained. In the following descriptions, "1" is referred to as a sequence number. In step S22, it is checked whether or not the frequency j of the bit duplication has reached "r", that is, the number of data elements to be duplicated. The frequency j of the bit duplication indicates the number of times the bit duplication has been performed on the source data u. If j>r, then it is assumed that the required frequency of the bit duplication has been performed, and the obtained data element ui is output as is in step S23. On the other hand, if j≦r, it is assumed that the bit duplication should be furthermore repeated, and control is passed to step S24.

In step S24, it is checked whether or not the sequence number i is a multiple of x. Unless the sequence number i is a multiple of x, no bit duplication is performed and control is then passed to step S23. On the other hand, if the sequence number i is a multiple of x, then the source data ui is output in steps S25 and S26. Thus, the source data ui is duplicated. In step S27, the frequency j of the bit duplication is then incremented.

In step S28, it is checked whether or not the sequence number i has reached N. If the sequence number i has not reached N, the sequence number i is incremented in step S29, and then control is passed back to step S21 to obtain the next data element. On the other hand, if the sequence number i has reached N, this it is assumed that all data elements of the source data has been processed in steps S21 through S29. Then, i and j are reset in step S30, thereby terminating the process.

Referring back to FIG. 13, the error-correcting encoding apparatus 80 duplicates a predetermined number of data elements in the source data to obtain a desired encoding rate. In other words, a desired encoding rate is obtained by duplicating a predetermined number of data elements in the source data. Since duplicated bits are used in the decoding process, they can reduce an error rate in a transmission path.

The decoding device for decoding a data sequence of the data encoded by the error-correcting encoding apparatus 80 only has to perform the process performed the bit duplication unit 81 in the inverse order after performing a normal decoding process.

Figure 16:
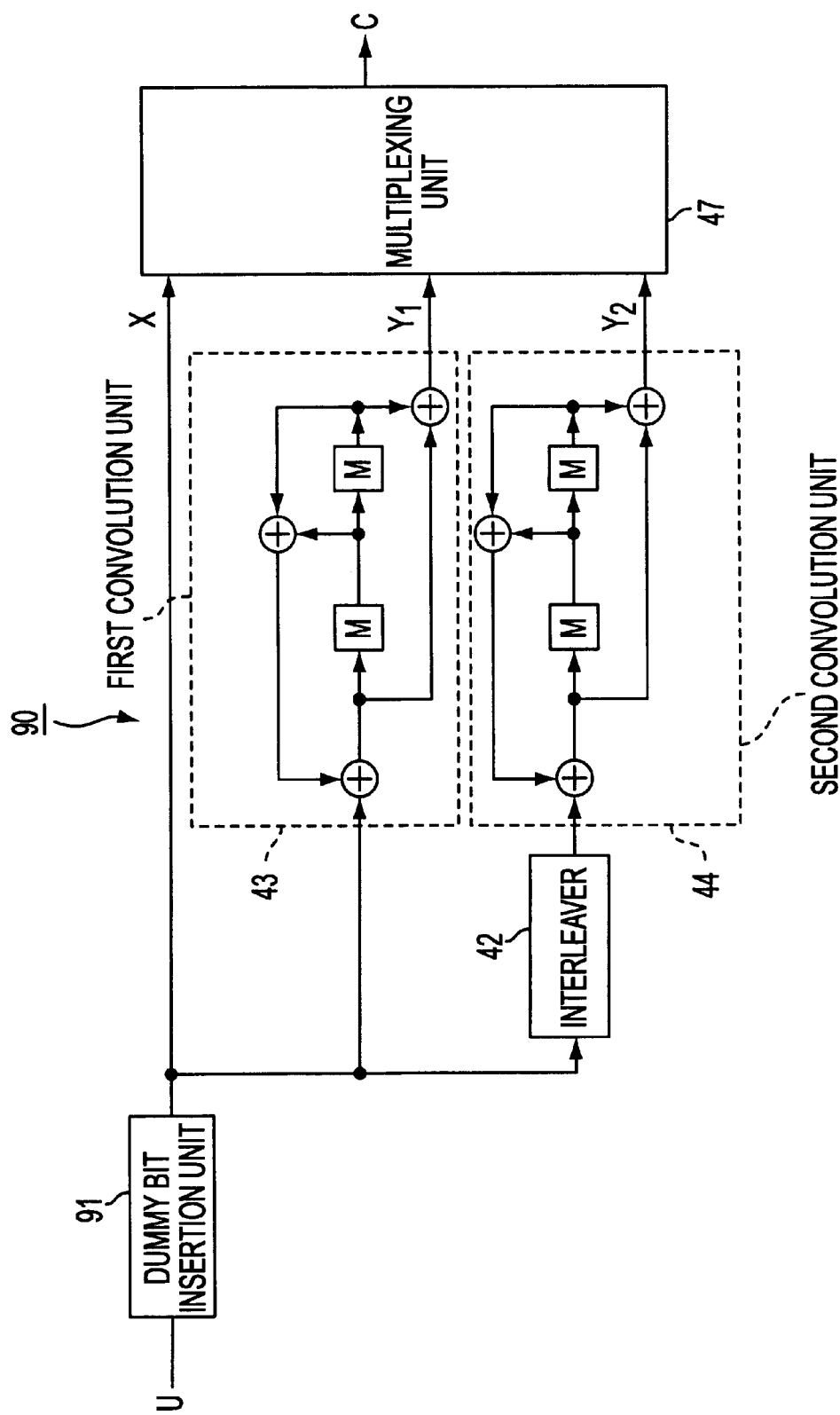
FIG. 16 is a block diagram showing an error-correcting encoding apparatus according to a further embodiment of the present invention.

FIG. 16 shows the configuration of an correcting encoding apparatus 90 according to a further embodiment of the present invention. In FIG. 16, the interleaver 42, the first convolution unit 43, the second convolution unit 44, and the multiplexing unit 47 are the same as those shown in FIG. 3.

The error-correcting encoding apparatus 90 further includes a dummy bit insertion unit 91. The dummy bit insertion unit 91 inserts a predetermined number of dummy bits into the source data u to obtain a desired encoding rate.

Described below is the operation of the dummy bit insertion unit 91. In the following description, it is assumed that the data length of the source data u is N bits, and the data length of an output data sequence is M bits. For example, M is larger than 3N, then a value smaller than 1/3 is desired as an encoding rate.

When the dummy bit insertion unit 91 obtains a data sequence Xk by inserting r dummy bits into the source data u, the data length of the data sequence Xk, the parity data sequence Y1k, and the parity data sequence Y2k is "N+r". Therefore, to set the data length of the output data sequence to M bits, the number of bits to be inserted by the dummy bit insertion unit 91 can be obtained by the following equation.

$$(N+r) \times 3 = M$$

$$\therefore r = M/3 - N$$

It is desired that the dummy bit insertion unit 91 inserts dummy bits having the same length as the constraint length. The constraint length refers to the number of bits of the data stored in the memory in the convoluting process as described above. Therefore, with the configuration shown in FIG. 13, the dummy bits are inserted into the source data u in 2-bit units.

The dummy bits can be either 1 or 0. If 1 is used as a dummy bit, and the constraint length is 2, then 11 is inserted as dummy data. For example, if the data length of the source data u is 250 bits, and the data length of a requested output sequence is 900 bits, then r=50. Thus, it is requested that 50 dummy bits are inserted into the source data u. If the constraint length is 2, '11' is inserted into the source data u at 25 points. It is also desired that the dummy data is inserted as evenly distributed.

When a data sequence with a dummy bit of "1" is inserted, encoded and transmitted, the precision of the decoding process on the subsequent data elements after the dummy data is improved.

Figure 22A:
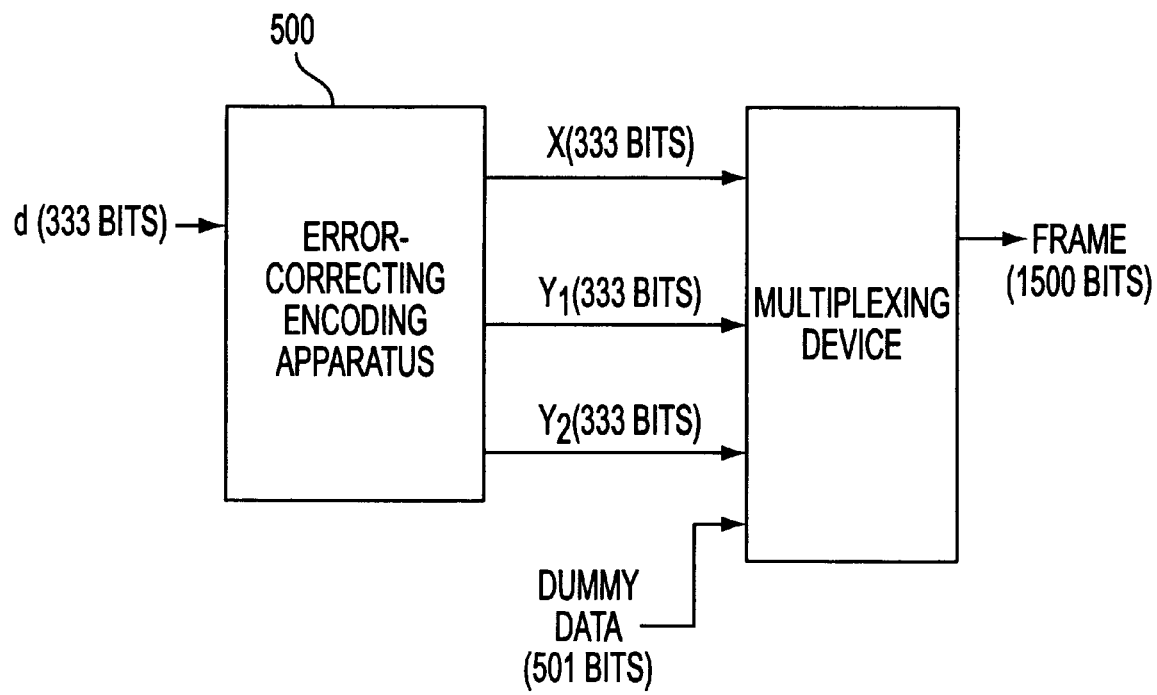
FIG. 22A is a diagram showing process of encoding source data using the error-correcting encoding apparatus shown in FIG. 20 and storing the encoded data in a frame of a fixed length.
Figure 22B:
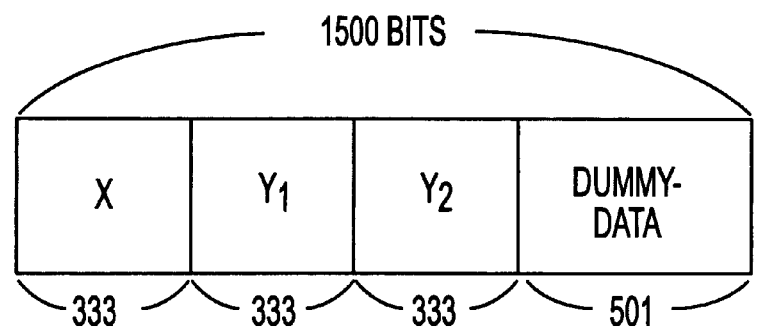
FIG. 22B shows a type of data stored in the frame.

As described above by referring to FIGS. 22 and 23, the conventional error-correcting encoding apparatuses often use dummy data. However, dummy data is added to the encoded data sequences in the conventional method. In contrast, the error-correcting encoding apparatus 90 inserts the dummy bits into the source data and the source data containing the dummy bits is then encoded. Thus, the dummy data is insignificant data in the conventional method whereas the error-correcting encoding apparatus 80 uses the dummy bits as a prior probability likelihood. Therefore, these dummy bits are useful data.

Figure 17:
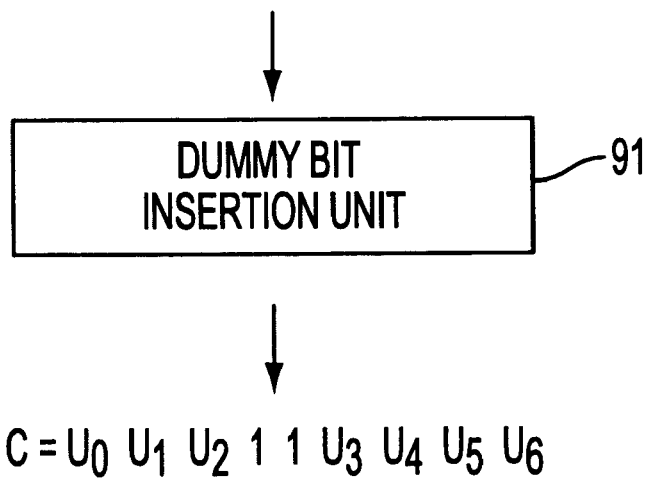
FIG. 17 is a diagram showing the operation performed by the dummy bit insertion unit.

FIG. 17 shows an example of an operation performed by the dummy bit insertion unit 91. In this example, the data length of the source data u is 7 bits, the constraint length is 2, and the data length of a requested output sequence is 27 bits. In this case, the encoding rate=7/27 is realized by inserting 2-bit dummy data into the source data u.

Thus, the error-correcting encoding apparatus 90 shown in FIG. 16 inserts a predetermined number of dummy bits into the source data to obtain a desired encoding rate. In other words, a desired encoding rate can be obtained by inserting a predetermined number of dummy bits into the source data. Since the inserted dummy bits are used in an encoding process, the error rate in a transmission path can be reduced.

The decoding device for decoding a data sequence encoded by the error-correcting encoding apparatus 90 only has to have the function of removing dummy bits after performing a normal decoding process.

The error-correcting encoding apparatuses shown in FIGS. 3, 13, and 16 are designed to have two convolution units connected in parallel with each other. The present invention is not limited to this configuration. That is, the present invention is applicable to a device having a plurality of convolution units connected in parallel with each other.

Figure 18:
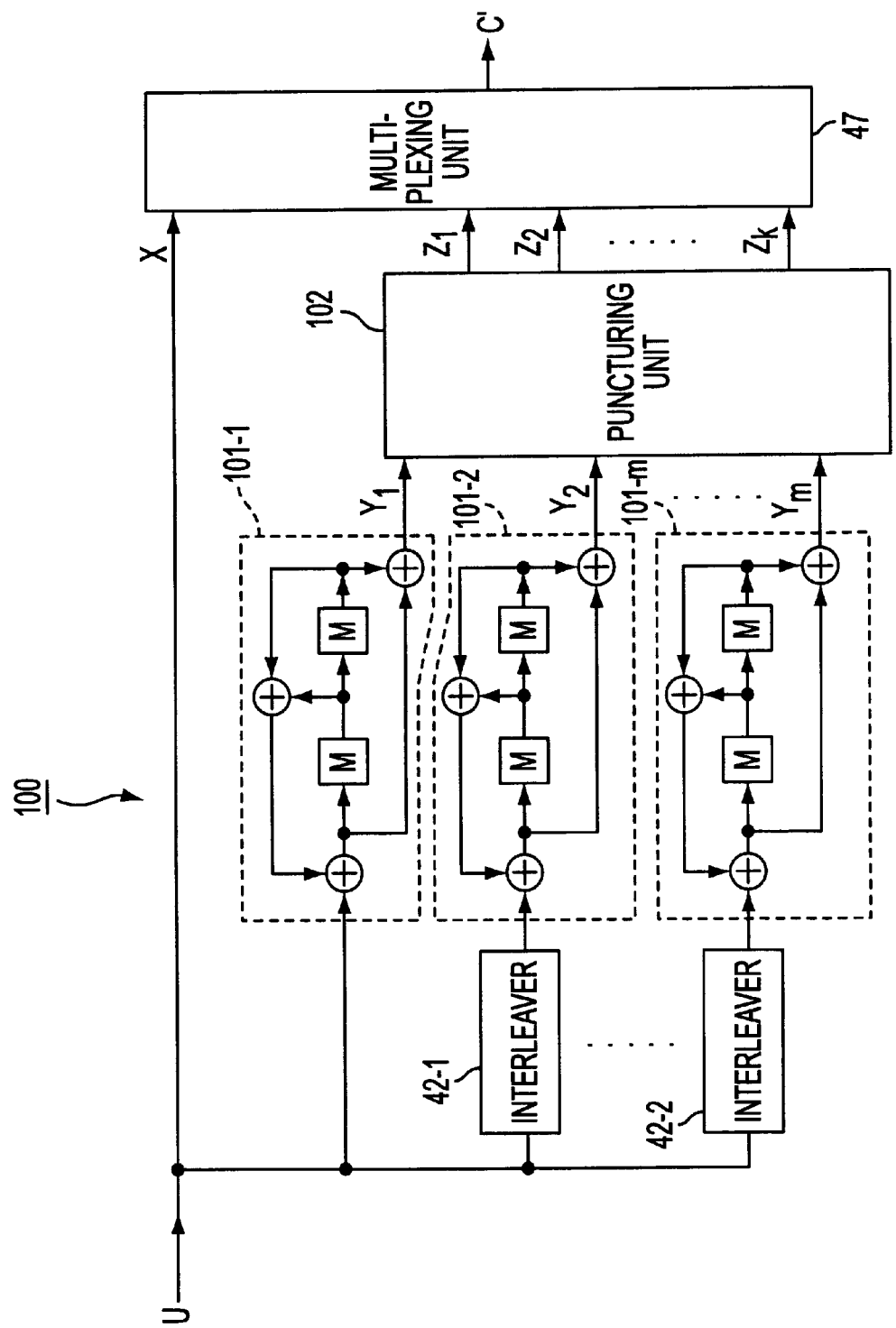
FIG. 18 is a block diagram of an error-correcting encoding apparatus including m convolution units.

FIG. 18 is a block diagram of an error-correcting encoding apparatus 100 including m convolution units. Convolution units 101-1 through 101-m perform convoluting processes on source data u. Different interleavers are provided for the convolution units 101-1 through 101-m. As a result, different sequences are provided to the convolution units 101-1 through 101-m.

A puncturing unit 102 selects a predetermined number of data elements from the parity data sequences Y1k through Ymk output respectively from the convolution units 101-1 through 101-m, and output the selected elements. For example, when the data length of the source data u is N bits and the data length of the output sequence C is M bits, that is, the encoding rate=N/M, the puncturing unit 102 selects the data elements as follows. Each of the convolution units 101-1 through 101-m outputs N-bit parity data when it is assigned an N-bit sequence.

If the puncturing unit 102 selects K1 through Km data elements respectively from the parity data sequences Y1k through Ymk, the following equation is obtained.

$$N+K1+K2+K3+\ldots+Km=M$$

If $K1=K2=K3=\ldots=Km=K$, then the following equation is obtained.

$$K=(M-N)/m$$

$$\therefore \text{encoding rate } R=N/M=(M-m\cdot K)/M$$

(where M>N, N>K)

Thus, the encoding rate R of the error-correcting encoding apparatus can be determined depending on the number of convolution units provided in parallel with each other, and the number of data elements to be selected from an N-bit sequence.

According to the above-described embodiments, the error-correcting encoding apparatuses shown in FIGS. 3, 13 and 16 are independent from each other. However, they can be optionally combined with each other. For example, the input unit of the error-correcting encoding apparatus 40 shown in FIG. 3 can be provided with the bit duplication unit 81 shown in FIG. 13, or the dummy bit insertion unit 91 shown in FIG. 10.

The error-correcting encoding apparatus according to the above described embodiments use systematic codes, and the configuration in which a convoluting process is performed. However, the present invention is not limited to this configuration. That is, the error-correcting encoding apparatus according to the present invention is not necessarily limited by systematic codes, nor limited to the configuration including a convolution unit.

Figure 19:
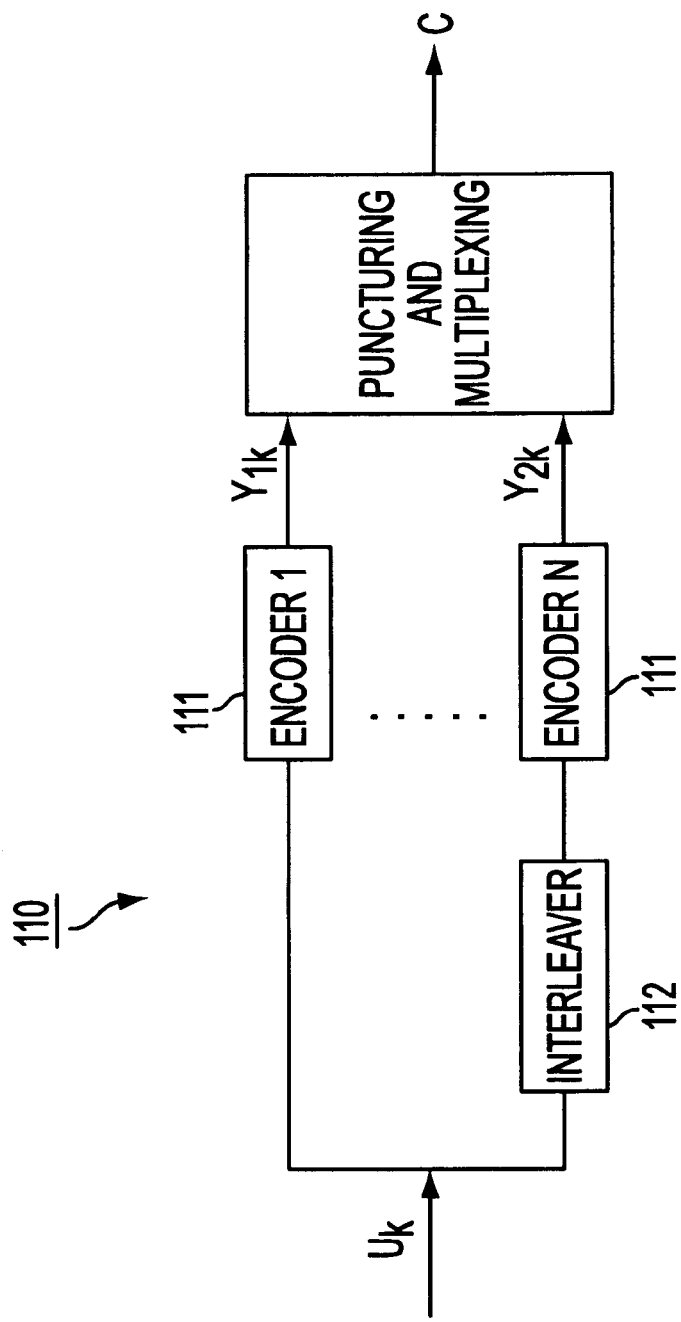
FIG. 19 is a block diagram showing the error-correcting encoding apparatus not limited by organization codes.

FIG. 19 is a block diagram of the error-correcting encoding apparatus not limited by systematic codes. An error-correcting encoding apparatus 110 includes a plurality of encoders 111. Each encoder 111 can reduce a convolutional code, or another block code (for example, a hamming code, a BCH code, etc.). Furthermore, an interleaver 112 is provided in such a way that the sequences provided for the respective encoders 111 are different from each other. As for the puncturing process and the multiplexing process, the configuration according to the above described embodiment is used.

A desired encoding rate (information rate) is obtained in an error-correcting encoding apparatus for encoding source data. Therefore, it is not necessary to transmit insignificant data by using this apparatus in a communications system. As a result, the transmission efficiency is improved and the decoding characteristic also can be improved.

What is claimed is:

1. An apparatus for encoding source data to transmit the encoded source data with a transmission frame, comprising:
   a first encoder encoding the source data to produce first parity data;
   an interleaver interleaving the source data to produce randomized data;
   a second encoder encoding the randomized data to produce second parity data;
   puncturing units determining a number of bits from the first and second parity data corresponding to a number of bits of the transmission frame, and selecting the first and second parity data to produce first selected data and second selected data corresponding to the determined number of bits; and
   a multiplexer combining the source data with the first and second selected data;
   wherein each of the puncturing units include a memory storing a puncturing table, wherein the bits selection from the first and second parity data is performed in accordance with the puncturing table and wherein each stored puncturing table provides an identical puncturing pattern for selecting bits from the first and second parity data.

2. The apparatus of claim 1, wherein the first and second encoders are convolutional encoders.

3. The apparatus of claim 1, which further includes an input unit providing the source data to the first encoder, interleaver and multiplexer.

4. The apparatus of claim 1, wherein the source data, first parity data and second parity data include N-bits, and the first and second selected data include less than N-bits.

5. A method for encoding source data to transmit the encoded source data with a transmission frame, comprising the steps of:

encoding the source data to produce first parity data;

interleaving the source data to produce randomized data;

encoding the randomized data to produce second parity data;

determining a number of bits from the first and second parity data corresponding to a number of bits of the transmission frame;

selecting the first and second parity data to produce first selected data and second selected data corresponding to the determined number of bits; and combining the source data with the first and second selected data;

wherein the selection of bits from the first and second parity data is performed in accordance with a puncturing table applying an identical puncturing pattern to the selection of bits from each of the first and second parity data.

6. The method of claim 5, wherein the source data, first parity data and second parity data include N-bits, and the first and second selected data include less than N-bits.

7. An apparatus for encoding source data to transmit the encoded source data with a transmission frame, comprising:

a plurality of interleavers for interleaving the source data to produce randomized data streams;

a plurality of encoders for encoding the source data and the randomized data streams to produce parity data streams;

puncturing units for determining a number of bits from the parity data streams corresponding to a number of bits of the transmission frame, and selecting the parity data streams to produce selected data streams corresponding to the determined number of bits; and a multiplexer for combining the source data with the selected data streams;

wherein the puncturing units each employ an identical puncturing pattern for selecting bits from the first and second parity data.

8. The apparatus of claim 7, wherein the encoders are convolutional encoders.

9. The apparatus of claim 7, wherein the source data and parity data include N-bits, and the selected data streams include less than N-bits.

10. An apparatus for encoding source data to transmit the encoded source data with a transmission frame, comprising:

a duplicating unit determining a number of bits duplicated of the source data, wherein the number of bits duplicated corresponds to the predetermined coding rate and a number of bits of the transmission frame, and duplicating the determined number of bits of source data to provide a data sequence;

a first encoder encoding the data sequence to produce first parity data;

an interleaver interleaving the data sequence to produce randomized data;

a second encoder encoding the randomized data to produce second parity data;

first and second puncturing units for determining a number of bits from the first and second parity data corresponding to a number of bits of the transmission frame, and selecting the first and second parity data to produce selected data streams corresponding to the determined number of bits; and a multiplexer combining the data sequence with the first and second parity data;

wherein the first and second puncturing units each employ an identical puncturing pattern for selecting bits from the first and second parity data.

11. The apparatus of claim 10, wherein the first and second encoders are convolutional encoders.

12. A method for encoding source data to transmit the encoded source data with a transmission frame, comprising the steps:

determining a number of bits of the source data, wherein the number of bits corresponds to a predetermined coding rate and a number of bits of the transmission frame;

duplicating the determined number of bits of the source data to provide a data sequence;

encoding the data sequence to produce first parity data;

interleaving the data sequence to produce randomized data;

encoding the randomized data to produce second parity data;

determining a number of bits from the first and second parity data corresponding to a number of bits of the transmission frame;

puncturing the first and second parity data to produce selected data streams corresponding to the determined number of bits; and combining the data sequence with the first and second parity data;

wherein one puncturing pattern is used for puncturing the first and second parity data.

13. An apparatus for encoding source data to transmit the encoded source data with a transmission frame, comprising:

an insertion unit determining a number of bits inserted to the source data, wherein the number of bits added corresponds to the predetermined coding rate and a number of bits of the transmission frame, and inserting the determined number of bits of source data to provide a data sequence;

a first encoder encoding the data sequence to produce first parity data;

an interleaver interleaving the data sequence to produce randomized data;

a second encoder encoding the randomized data to produce second parity data; and a multiplexer combining the data sequence with the first and second parity data;

wherein the bits added are dummy bits.

14. The apparatus of claim 13, wherein the first and second encoders are convolutional encoders.

15. A method for encoding source data to transmit the encoded source data with a transmission frame, comprising the steps:

determining a number of bits inserted in the source data, wherein the number of bits corresponds to a predetermined coding rate and a number of bits of the transmission frame;

inserting the determined number of bits to the source data to provide a data sequence;

encoding the data sequence to produce first parity data;

interleaving the data sequence to produce randomized data;

encoding the randomized data to produce second parity data;

puncturing the first and second parity data to produce selected data streams corresponding to the determined number of bits; and combining the data sequence with the first and second parity data;

wherein one puncturing pattern is used for puncturing the first and second parity data.

16. An apparatus for encoding source data to transmit the encoded source data with a transmission frame, comprising:
   a first encoder encoding the source data to produce first additional data;
   randomizing means randomizing the source data to produce randomized data;
   a second encoder encoding the randomized data to produce second additional data;
   determining means determining a number of bits from the first and second additional data corresponding to a number of bits of the transmission frame;
   selecting means selecting bits corresponding to the determined number of bits from the first and second additional data to produce first selected data and second selected data; and
   a multiplexer multiplexing the source data with the first and second selected data;
   wherein puncturing means employing one puncturing pattern is used for selecting the first selected data and the second selected data.

* * * * *